(12) United States Patent
Ikenaga et al.

(10) Patent No.: US 11,739,412 B2
(45) Date of Patent: Aug. 29, 2023

(54) DEPOSITION MASK AND PRODUCTION METHOD OF DEPOSITION MASK

(71) Applicant: Dai Nippon Printing Co., Ltd., Tokyo (JP)

(72) Inventors: Chikao Ikenaga, Tokyo (JP); Daigo Aoki, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 85 days.

(21) Appl. No.: 16/828,287

(22) Filed: Mar. 24, 2020

(65) Prior Publication Data

US 2020/0308688 A1    Oct. 1, 2020

(30) Foreign Application Priority Data

Mar. 28, 2019    (JP) .................................. 2019-064890

(51) Int. Cl.
| | |
|---|---|
| *C23C 14/04* | (2006.01) |
| *C23F 1/00* | (2006.01) |
| *H10K 71/16* | (2023.01) |

(52) U.S. Cl.
CPC .............. *C23C 14/042* (2013.01); *C23F 1/00* (2013.01); *H10K 71/166* (2023.02)

(58) Field of Classification Search
CPC .................................................. C23C 14/042
See application file for complete search history.

(56) References Cited

U.S. PATENT DOCUMENTS

| | | | |
|---|---|---|---|
| 2012/0060756 A1* | 3/2012 | Ookawara | ............. C23C 14/042 118/504 |
| 2015/0041793 A1* | 2/2015 | Chan | ....................... H01L 51/56 257/40 |

(Continued)

FOREIGN PATENT DOCUMENTS

| | | |
|---|---|---|
| EP | 3 680 949 A2 | 7/2020 |
| JP | 5382259 B1 | 1/2014 |

(Continued)

OTHER PUBLICATIONS

Taiwanese Office Action (Application No. 109110526) dated Oct. 21, 2020 (with English translation).

(Continued)

*Primary Examiner* — Keath T Chen
(74) *Attorney, Agent, or Firm* — BURR PATENT LAW, PLLC

(57) ABSTRACT

A wall surface of an opening of a deposition mask includes a first wall surface that extends from a first end toward a second surface, a second wall surface that extends from a second end toward a first surface, and a connection at which the first wall surface is connected to the second wall surface. When the opening is viewed from the first surface side along a normal direction of the first surface, the first end of the opening includes a first portion that extends in a first direction and has a first dimension and a second portion that extends in a second direction intersecting the first direction and a second dimension shorter than the first dimension. The first wall surface includes a first wall surface section that extends from the first portion toward the connection and a second wall surface section that extends from the second portion toward the connection. A height of the first wall surface section is lower than a height of the second wall surface section.

21 Claims, 20 Drawing Sheets

(56) References Cited

U.S. PATENT DOCUMENTS

2017/0141315 A1* 5/2017 Ikenaga .............. B21B 15/0007
2019/0144989 A1  5/2019 Nishi

FOREIGN PATENT DOCUMENTS

| JP | 2017-197797 A1 | 11/2017 |
| JP | WO2018/025835 A1 | 2/2018 |
| JP | 2019-023350 A1 | 2/2019 |
| TW | 201816146 A | 5/2018 |
| WO | 2019/050198 A2 | 3/2019 |

OTHER PUBLICATIONS

Extended European Search Report (Application No. 20166143.6) dated Jul. 29, 2020.

* cited by examiner

| | H1 [μm] | H2 [μm] | L1 [μm] | L2 [μm] | L3 [μm] | L4 [μm] | K1 [μm] | K2 [μm] | Effective Area | Strength |
|---|---|---|---|---|---|---|---|---|---|---|
| Example 1 | 3 | 4 | 48 | 46 | 40 | 40 | 3 | 4 | Good | Great |
| Example 2 | 2 | 4 | 48 | 46 | 40 | 42 | 2 | 4 | Great | Great |
| Example 3 | 2 | 3 | 48 | 46 | 42 | 42 | 2 | 3 | Great | Good |
| Comparative Example 1 | 4 | 4 | 48 | 46 | 40 | 38 | 4 | 4 | Bad | Great |
| Comparative Example 2 | 2 | 2 | 48 | 46 | 44 | 42 | 2 | 2 | Great | Bad |

DEPOSITION MASK AND PRODUCTION METHOD OF DEPOSITION MASK

CROSS-REFERENCE TO RELATED APPLICATIONS

This application is based upon and claims the benefit of priority from Japanese Patent Application No. 2019-64890, filed Mar. 28, 2019; the entire contents of which are incorporated herein by reference.

BACKGROUND

Field

Embodiments of the present disclosure relate to a deposition mask and a production method of a deposition mask.

Background Art

In electronic devices such as smartphones and tablet PCs, high-definition display devices are demanded from the market in recent years. A display device has a pixel density of, for example, 400 ppi or more or 800 ppi or more.

Attention has been paid to the organic EL display device because of its excellent responsibility, and/or low power consumption, and/or high contrast. A known method for forming pixels of an organic EL display device is a method for depositing a material that constitutes pixels on a substrate by deposition. In this case, first, a deposition mask including openings is prepared. Next, an organic material and/or inorganic material or the like is deposited in a state in which the deposition mask is closely in contact with a substrate in the deposition apparatus, thereby forming an organic material and/or inorganic material or the like on the substrate.

As a production method of the deposition mask, for example, as disclosed in Patent Document 1, a method for forming openings in a metal plate by etching the metal plate is known.

PRIOR ART DOCUMENTS

Patent Documents

Patent Document 1: Japanese Patent No. 5382259

SUMMARY

Technical Problem

In the deposition step, some of a deposition material moving toward a deposition mask from a deposition source moves along a direction inclined with respect to the normal direction of a metal plate of the deposition mask. Some of the deposition material moving along a direction inclined with respect to the normal direction of the metal plate adheres to a wall surface of an opening but not to a substrate. Accordingly, at a position near the wall surface of the opening, a deposition layer formed on the substrate is likely to be thin. Such a phenomenon in which the deposition material is prevented from adhering to the substrate by the wall surface of the opening is also referred to as "shadow".

In order to suppress the occurrence of shadow, it is possible to reduce the height of the wall surface of the opening of the deposition mask. However, when the height of the wall surface of the opening over the entire deposition mask, the strength of the deposition mask is reduced, which is likely to cause damage or deformation of the deposition mask.

An object of embodiments of the disclosure is to provide a deposition mask and a production method of a deposition mask, by which such problems can be effectively solved.

Solution to Problem

A deposition mask including openings in one embodiment of the present disclosure comprises:
 a first surface,
 a second surface that is located opposite to the first surface; and
 a wall surface including a first end that is an end located on the first surface and a second end that is an end located on the second surface;
 wherein the wall surface defines each of the openings,
 wherein the wall surface includes a first wall surface that extends from the first end toward the second surface, a second wall surface that extends from the second end toward the first surface, and a connection at which the first wall surface is connected to the second wall surface,
 wherein when the opening is viewed from the first surface side along a normal direction of the first surface, the first end of the opening includes a first portion that extends in a first direction and has a first dimension and a second portion that extends in a second direction intersecting the first direction and has a second dimension shorter than the first dimension,
 wherein the first wall surface includes a first wall surface section that extends from the first portion toward the connection and a second wall surface section that extends from the second portion toward the connection, and
 wherein a height of the first wall surface section is lower than a height of the second wall surface section.

Advantageous Effects

According to the deposition mask of embodiments of the present disclosure, it is possible to suppress the occurrence of shadow while suppressing the generation of defects such as deformation of the deposition mask.

DETAILED DESCRIPTION

Figure 1:
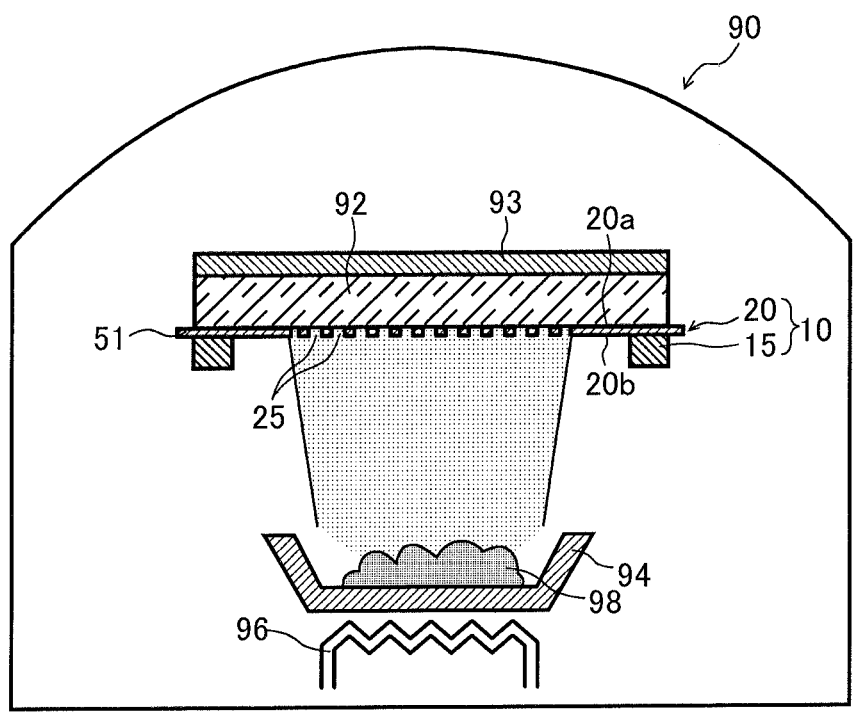
FIG. 1 is a view for illustrating a deposition apparatus including a deposition mask apparatus according to one embodiment of the disclosure.

In the present specification and the drawings, unless otherwise specified, terms each meaning a material that is the basis of a certain structure, e.g., "substrate", "base material", "plate", "sheet", and "film", are not distinguished from each other based solely on the difference in designation.

In the present specification and the drawings, unless otherwise specified, terms specifying shapes, geometric conditions, and their degrees, e.g., "parallel" and "perpendicular" and values of lengths, angles, and the like are not limited to their strict definitions, but construed to include a range of capable of exerting a similar function.

In the present specification and the drawings, unless otherwise specified, when a certain structure of a certain member, a certain region, or the like is "above" or "below", "on the upper side of" or "on the lower side of", or "upward toward" or "downward toward" another structure of another member, another area, or the like, it includes a case in which a structure is in direct contact with another structure. Further, this also includes a case in which another structure is included between a certain structure and another structure, which means a case in which they are indirectly in contact with each other. Unless otherwise specified, the terms "above", "upper side", or "upward" and "below", "lower side", or "downward" may be interchangeable when the vertical direction is reversed.

In the present specification and the drawings, unless otherwise specified, the same portions or portions having similar functions are denoted by the same reference numerals or similar reference numerals, and repeated description thereof may be omitted. In addition, the dimensional ratios in the drawings may be different from actual ratios for convenience of description, or some of the components may be omitted from the drawings.

In the present specification and the drawings, unless otherwise specified, the embodiments and examples may be combined with other embodiments and modified examples unless there is contradiction. Further, the other embodiments, or other embodiments and modified examples may be combined unless there is contradiction. Further, the modified examples may be combined with each other unless there is contradiction.

In the present specification and the drawings, unless otherwise specified, when a plurality of steps is disclosed in relation to a method such as a production method, other steps that are not disclosed may be performed between the disclosed steps. In addition, the order of the disclosed steps is appropriately unless there is contradiction.

In the present specification and the drawings, unless otherwise specified, the numerical ranges expressed by the sign "-" include numerical values placed before and after the sign "-". For example, the numerical range defined by the expression "34%-38% by mass" is the same as the numerical range defined by the expression "34% or more and 38% or less by mass".

In one embodiment described herein, an example relating to a deposition mask used for patterning an organic material on a substrate in a desired pattern when producing an organic EL display device and a method for producing the same will be described in the present specification and the drawings, unless otherwise specified. However, without being limited to such an application, the present embodiment can be applied to a deposition mask used for various uses. For example, the mask of the embodiment may be used to produce an apparatus for displaying or projecting an image or video for expressing virtual reality, so-called VR, or augmented reality, so-called AR.

A first aspect of the present disclosure is a deposition mask including openings which comprises:

a first surface, a second surface that is located opposite to the first surface; and a wall surface including a first end that is an end located on the first surface and a second end that is an end located on the second surface;

wherein the wall surface defines each of the openings, wherein the wall surface includes a first wall surface that extends from the first end toward the second surface, a second wall surface that extends from the second end toward the first surface, and a connection at which the first wall surface is connected to the second wall surface, wherein when the opening is viewed from the first surface side along a normal direction of the first surface, the first end of the opening includes a first portion that extends in a first direction and has a first dimension and a second portion that extends in a second direction intersecting the first direction and has a second dimension shorter than the first dimension, wherein the first wall surface includes a first wall surface section that extends from the first portion toward the connection and a second wall surface section that extends from the second portion toward the connection, and wherein a height of the first wall surface section is lower than a height of the second wall surface section.

According to a second aspect of the present disclosure, in the deposition mask in the first aspect described above, the second dimension may be 2 μm or more shorter than the first dimension, and a height of the first wall surface section may be 1 μm or more lower than a height of the second wall surface section.

According to a third aspect of the present disclosure, in the deposition mask in the first or second aspect described above, when the openings are viewed from the first surface side along the normal direction of the first surface, a first interval may be greater than a second interval, wherein the first interval is an interval between two of the openings which are adjacent to each other in a direction orthogonal to the first direction, and wherein the second interval is an interval between two of the openings which are adjacent to each other in a direction orthogonal to the second direction.

According to a fourth aspect of the present disclosure, in the deposition mask in the third aspect described above, a difference between the first interval and the second interval may be 2 μm or more.

According to a fifth aspect of the present disclosure, in the deposition mask in the third aspect described above, a difference between the first interval and the second interval may be 5 μm or more.

According to a sixth aspect of the present disclosure, in the deposition mask in each of the third to fifth aspects described above, a difference between the first interval and the second interval may be 100 μm or less.

According to a seventh aspect of the present disclosure, in the deposition mask in each of the first to sixth aspects described above, a first height and a second height may be smaller than a thickness of the deposition mask, wherein the first height is the height of the wall surface on a cross-section orthogonal to the first direction including a center part of the first portion, and wherein the second height is the height of the wall surface on a cross-section orthogonal to the second direction including a center part of the second portion.

According to an eighth aspect of the present disclosure, in the deposition mask in the seventh aspect described above, a difference between the first height and the second height may be 0.3 times or more the thickness of the deposition mask.

According to a ninth aspect of the present disclosure, in the deposition mask in the seventh or eighth aspect described above, a difference between the first height and the second height may be 0.7 times or less the thickness of the deposition mask.

According to a tenth aspect of the present disclosure, in the deposition mask in each of the first to ninth aspects described above, the height of the first wall surface section and the height of the second wall surface section may be 5 μm or less According to an eleventh aspect of the present disclosure, in the deposition mask in each of the first to tenth aspects described above, the thickness of the deposition mask may be 30 μm or less.

A twelfth aspect of the present disclosure is a production method of a deposition mask including openings, comprising:

a step of preparing a metal plate including a first surface and a second surface that is located opposite to the first surface; and an etching step of etching the metal plate, thereby forming the openings in the metal plate, wherein the opening has a wall surface including a first end that is an end located on the first surface and a second end that is an end located on the second surface, wherein the wall surface includes a first wall surface that extends from the first end toward the second surface, a second wall surface that extends from the second end toward the first surface, and a connection at which the first wall surface is connected to the second wall surface, wherein the etching step includes a first surface etching step of etching the first surface using an etching solution, thereby forming the first wall surface, and a second surface etching step of etching the second surface using an etching solution, thereby forming the second wall surface, wherein when the opening is viewed from the first surface side along a normal direction of the first surface, the first end of the opening includes a first portion that extends in a first direction and has a first dimension and a second portion that extends in a second direction intersecting the first direction and has a second dimension shorter than the first dimension, wherein the first wall surface includes a first wall surface section that extends from the first portion toward the connection and a second wall surface section that extends from the second portion toward the connection, and wherein a height of the first wall surface section is lower than a height of the second wall surface section.

According to a thirteenth aspect of the present disclosure, in the production method of a deposition mask in the twelfth aspect described above, the second dimension may be 2 μm or more shorter than the first dimension, and a height of the first wall surface section may be 1 μm or more lower than a height of the second wall surface section.

According to a fourteenth aspect of the present disclosure, in the production method of a deposition mask in the twelfth or thirteenth aspect described above, the second surface etching step may include a step of etching an area of the second surface which is not covered with a second resist pattern using an etching solution.

the second resist pattern may include a first resist portion that extends along the first portion of the first end and has a first width and a second resist portion that extends along the second portion of the first end and has a second width, and the first width may be greater than the second width.

According to a fifteenth aspect of the present disclosure, in the production method of a deposition mask in the fourteenth aspect described above, a difference between the first width and the second width may be 2 μm or more.

According to a sixteenth aspect of the present disclosure, in the production method of a deposition mask in the fourteenth aspect described above, a difference between the first width and the second width may be 5 μm or more.

According to a seventeenth aspect of the present disclosure, in the production method of a deposition mask in each of the fourteenth to sixteenth aspects described above, a difference between the first width and the second width may be 100 μm or less.

According to an eighteenth aspect of the present disclosure, in the production method of a deposition mask in each of the fourteenth to seventeenth aspects described above, the second surface etching step may be carried out until a gap is formed between the metal plate and the first resist portion and between the metal plate and the second resist portion.

According to a nineteenth aspect of the present disclosure, in the production method of a deposition mask in each of the twelfth to eighteenth aspects described above, the thickness of the metal plate may be 50 μm or less or 30 μm or less.

Hereinafter, an embodiment of the present disclosure will be described in detail with reference to the drawings. The embodiment described below is an example of an embodiment of the present disclosure, and the present disclosure is not construed as being limited to only such embodiment.

Firstly, a deposition apparatus 90 for performing a deposition process for depositing a deposition material on an object is explained with reference to FIG. 1. As shown in FIG. 1, the deposition apparatus 90 may include therein a deposition source 94, a heater 96, and a deposition mask apparatus 10. In addition, the deposition apparatus 90 may further include exhaust means to create a vacuum atmosphere inside of the deposition apparatus 90. The deposition source 94 is, for example, a crucible that may accommodate a deposition material 98 such as an organic luminescent material. The heater 96 is configured to heat the crucible 94 to evaporate the deposition material 98 in the vacuum atmosphere. The deposition mask apparatus 10 may be placed opposite to the deposition source 94.

Hereinafter, the deposition mask apparatus 10 is described. As shown in FIG. 1, the deposition mask apparatus 10 may include at least one deposition mask 20 and a flame 15 that supports the deposition mask 20. The frame 15 is configured to hold the deposition mask 20 in a taut state in the planar direction in order to suppress the deposition mask 20 from warping. The deposition mask apparatus 10 is disposed in a deposition apparatus 90 such that the deposition mask 20 faces a substrate as an object, onto which the deposition material 98 is to be deposited, for example, an organic EL substrate 92, as shown in FIG. 1. The deposition mask 20 may have a plurality of openings 25 through which the deposition material 98 from the deposition source passes. In the following description, among surfaces of the deposition mask 20, a surface toward a substrate such as an organic EL substrate 92 to which the deposition material 98 adheres is referred to as "first surface 20a", and a surface opposite to the first surface 20a is referred to as "second surface 20b".

The deposition apparatus 10 may include a magnet 93 disposed on a surface of the organic EL substrate 92, which is opposite to the surface on the deposition mask 20 side, as shown in FIG. 1. By providing the magnet 93, the deposition mask 20 can be attracted to the magnet 93 by magnetic force, and the deposition mask 20 can be brought into close contact with the organic EL substrate 92. Thus, it is possible to suppress the occurrence of shadow in the deposition step thereby improving the dimensional accuracy and positional accuracy of the deposition material 98 attached to the organic EL substrate 92. Alternatively, the deposition mask 20 may be brought into close contact with the organic EL substrate 92 by using an electrostatic chuck that utilizes electrostatic force.

Figure 3:
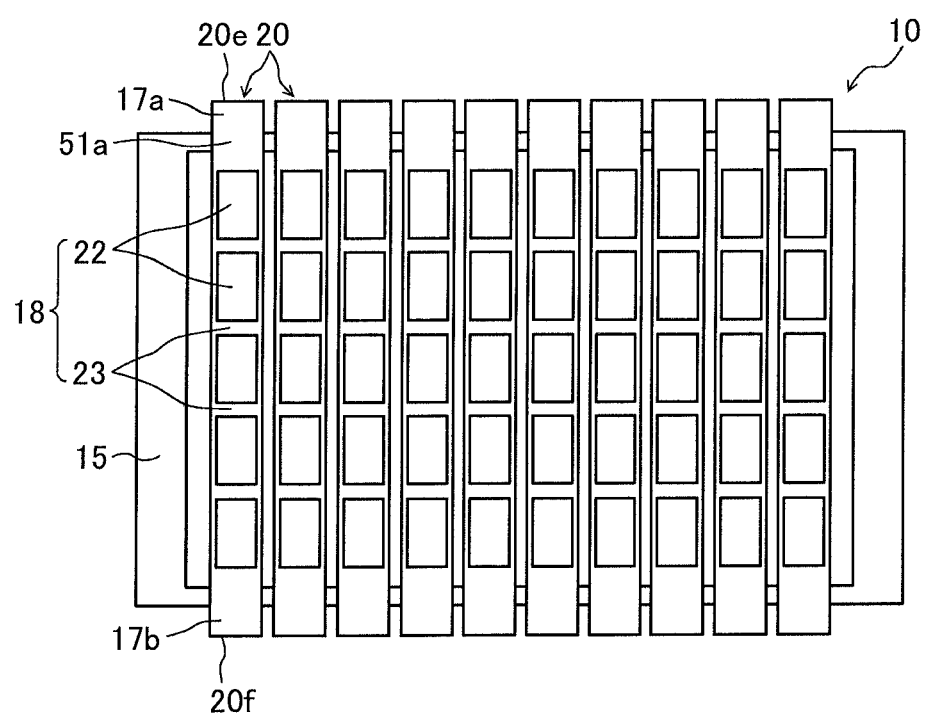
FIG. 3 is a plan view illustrating a deposition mask apparatus according to one embodiment of the disclosure.

FIG. 3 is a plan view of the deposition mask apparatus 10 when viewed from the first surface 20a side of the deposition mask 20. As shown in FIG. 3, the deposition mask apparatus 10 may include a plurality of deposition masks 20. In this embodiment, each deposition mask 20 may have a rectangular shape extending in one direction. In the deposition mask apparatus 10, a plurality of deposition masks 20 may be arranged in the width direction intersecting the length direction of the deposition masks 20. Each deposition mask 20 is fixed via both end portions in the longitudinal direction of the deposition mask 20 to the frame 15 by, for example, welding. In addition, although not shown, the deposition mask apparatus 10 may include a member which is fixed to the flame 15 and partially overlaps the deposition mask 20 in the thickness direction of the deposition mask 20. Examples of such a member may include a member which extends in a direction intersecting the length direction of the deposition mask 20 and supports the deposition mask 20 and a member which overlaps a gap between two adjacent deposition masks.

Figure 2:
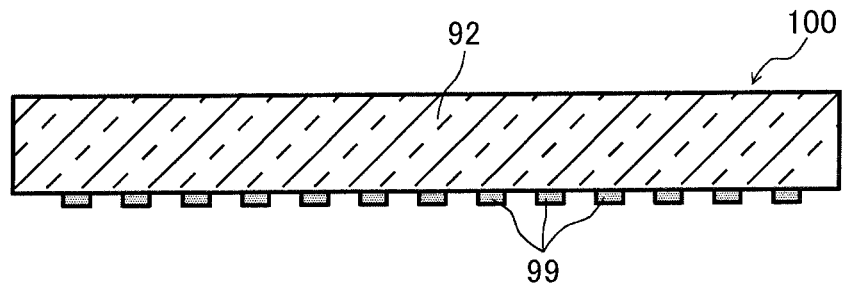
FIG. 2 is a cross-sectional view of an organic EL display device produced using the deposition mask illustrated in FIG. 1.

FIG. 2 is a cross-sectional view of an organic EL display device 100 produced using the deposition apparatus 90 illustrated in FIG. 1. The organic EL display device 100 may include an organic EL substrate 92 and a deposition layer 99 including a deposition material 98 provided in a pattern. Note that an electrode for applying a voltage to the deposition layer 99, a layer for promoting the movement of carriers such as holes and electrons, and the like are omitted in the organic EL display device 100 in FIG. 2. In addition, after the deposition step of providing a deposition layer 99 in a pattern on an organic EL substrate 92, other components of an organic EL display device may be provided to the organic EL display device 100 in FIG. 2. Therefore, the organic EL display device 100 in FIG. 2 may also be referred to as "organic EL display device intermediate".

When it is desired to perform color display with a plurality of colors, it is possible to prepare deposition apparatuses 90, on which deposition masks 20 corresponding to the respective colors are separately mounted, and insert an organic EL substrate 92 sequentially into the deposition apparatuses 90. Thus, for example, an organic luminescent material for red color, an organic luminescent material for green color, and an organic luminescent material for blue color can be sequentially deposited on the organic EL substrate 92.

The deposition process may be carried out in a deposition apparatus 90 having a high temperature atmosphere. In this case, during the deposition process, the deposition mask 20, the flame 15, and the organic EL substrate 92, which are maintained in the deposition apparatus 90, are also heated. At such time, the deposition mask 20, the flame 15, and the organic EL substrate 92 exhibit a dimensional change behavior based on their respective thermal expansion coefficients. In this case, when the thermal expansion coefficients of the deposition mask 20 and the flame 15 are significantly different from the thermal expansion coefficient of the organic EL substrate 92, misalignment occurs due to the difference in their dimensional changes. As a result, the dimensional accuracy and the positional accuracy of the deposition material attached to the organic EL substrate 92 may deteriorate.

In order to solve such a problem, it is preferable that the thermal expansion coefficients of the deposition mask 20 and the flame 15 are equivalent to the thermal expansion coefficient of the organic EL substrate 92. For example, in a case in which a glass substrate is used as the organic EL substrate 92, an iron alloy containing nickel can be used as a main material of the deposition mask 20 and the flame 15. The iron alloy may further contain cobalt as well as nickel. For example, it is possible to use, as a material for a metal plate forming the deposition mask 20, an iron alloy containing nickel and cobalt at a total content of 30% by mass or more and 54% by mass or less in which the cobalt content is 0% by mass or more and 6% by mass or less. Concrete examples of an iron alloy containing nickel or nickel and cobalt may be an invar material containing 34% by mass or more and 38% by mass or less of nickel, a super invar material containing cobalt in addition to 30% by mass or more and 34% by mass or less of nickel, or a low thermal expansion Fe—Ni based plated alloy containing 38% by mass or more and 54% by mass or less of nickel.

Note that in a case in which the temperatures of the deposition mask 20, the flame 15, and the organic EL substrate 92 do not reach high temperatures during the deposition process, it is not particularly necessary to adjust the thermal expansion coefficients of the deposition mask 20 and the flame 15 to the thermal expansion coefficient of the organic EL substrate 92. In this case, a material other than the above-described iron alloy may be used as a material forming the deposition mask 20. For example, iron alloys other than the above-described iron alloy containing nickel such as an iron alloy containing chromium may be used. As the iron alloy containing chromium, for example, an iron alloy which is so-called stainless steel can be used. Further, alloys other than iron alloys such as nickel and nickel-cobalt alloys may be used.

First, end parts 17a, 17b will be described in detail. End parts 17a, 17b are fixed to the flame 15 of the deposition mask 20. The first end part 17a includes a first end portion 20e that is one longitudinal end of the deposition mask 20. The second end part 17b includes a second end portion 20f that is the other longitudinal end of the deposition mask 20.

In this embodiment, the end parts 17a, 17b are formed integrally with an intermediate part 18. The end parts 17a, 17b may be formed with a member other than the intermediate part 18. In this case, the end parts 17a, 17b are joined to the intermediate part 18 by, for example, welding.

Next, the intermediate part 18 will be explained. The intermediate part 18 includes at least one effective area 22 on which openings 25 are formed and a peripheral area 23 surrounding the effective area 22. The openings 25 pass through the deposition mask 20 from the first surface 20a to the second surface 20b. The effective area 22 is an area facing a display area of the organic EL substrate 92 of the deposition mask 20.

In the example shown in FIG. 3, the intermediate part 18 includes a plurality of effective areas 22 arranged at predetermined intervals along the length direction of the deposition mask 20. One effective area 22 corresponds to a display area of one organic EL display device 100. Therefore, the deposition mask apparatus 10 shown in FIG. 1 can form the deposition layer constituting the organic EL display devices 100 on one substrate. A single effective area 22 may also correspond to a plurality of display areas. Although not shown, a plurality of effective areas 22 may be arranged at predetermined intervals in the width direction of the deposition mask 20.

As shown in FIG. 3, each effective area 22 has an outline of, for example, a substantially quadrangular shape in plan view, more precisely, a substantially rectangular shape in plan view. Although not shown, each effective area 22 may have an outline of a different shape in accordance with the shape of the display area of the organic EL substrate 92. For example, each effective area 22 may have a circular outline.

Figure 4A:
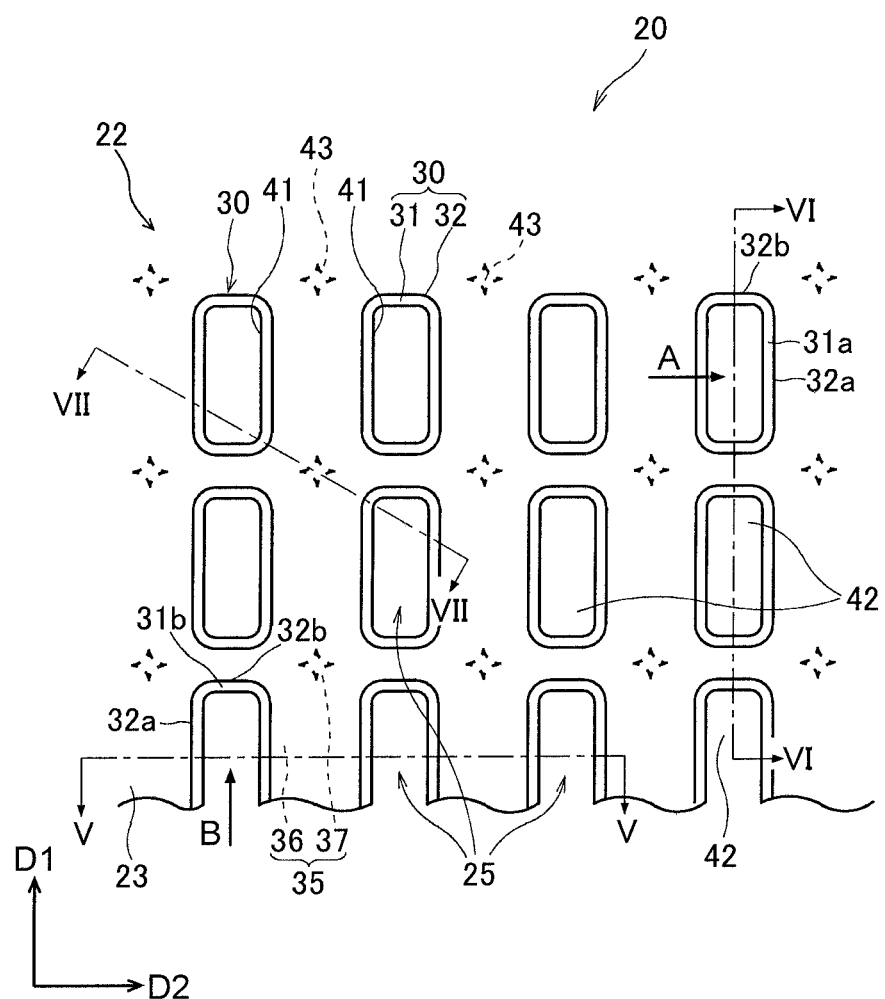
FIG. 4A is a plan view of the effective area of the deposition mask in FIG. 3 when viewed from the first surface side.
Figure 4B:
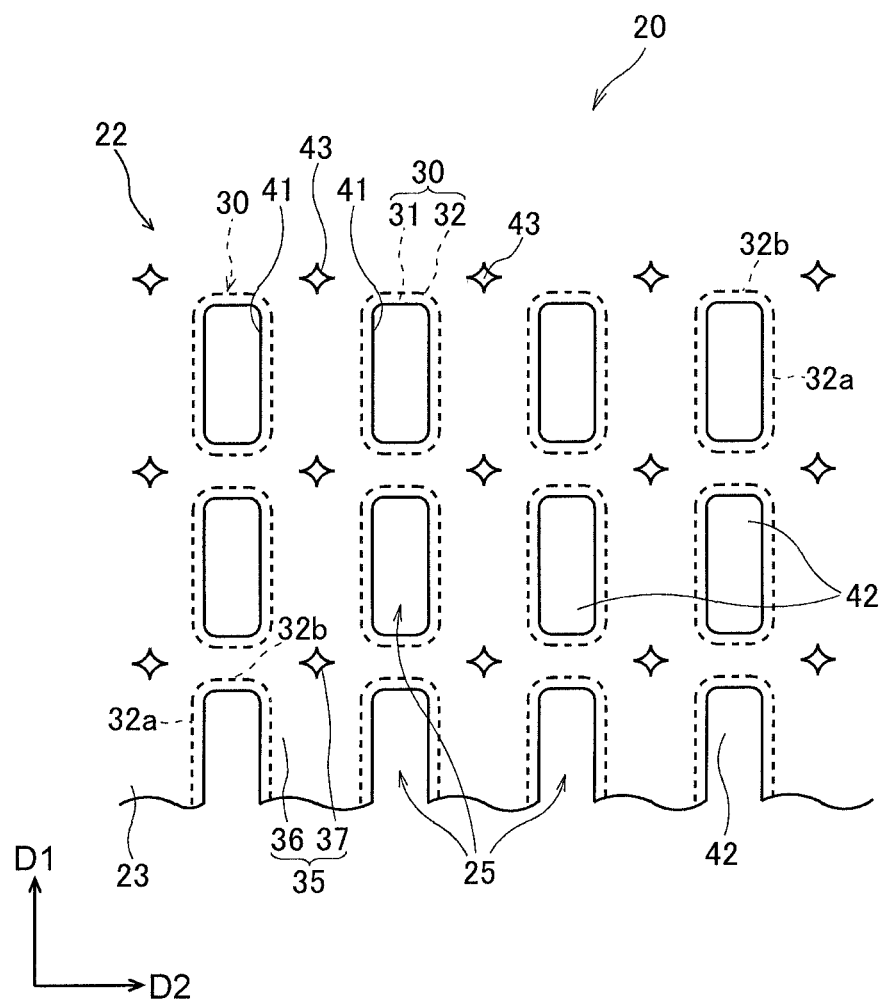
FIG. 4B is a plan view of the effective area of the deposition mask in FIG. 3 when viewed from the second surface side.
Figure 5:
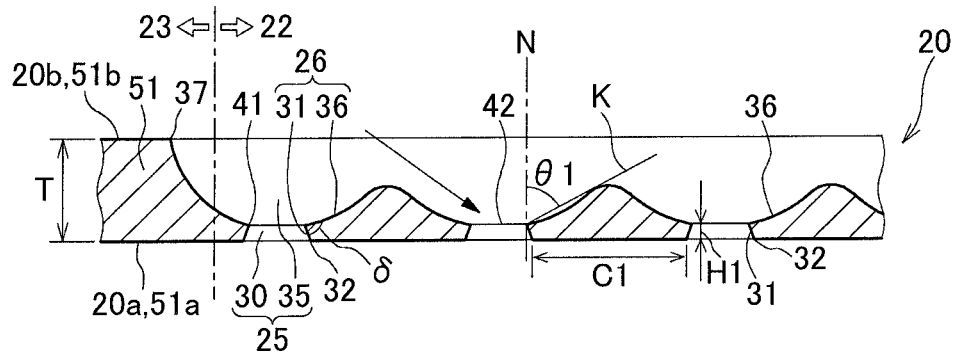
FIG. 5 is a cross-sectional view along the V-V line of FIG. 4A.
Figure 6:
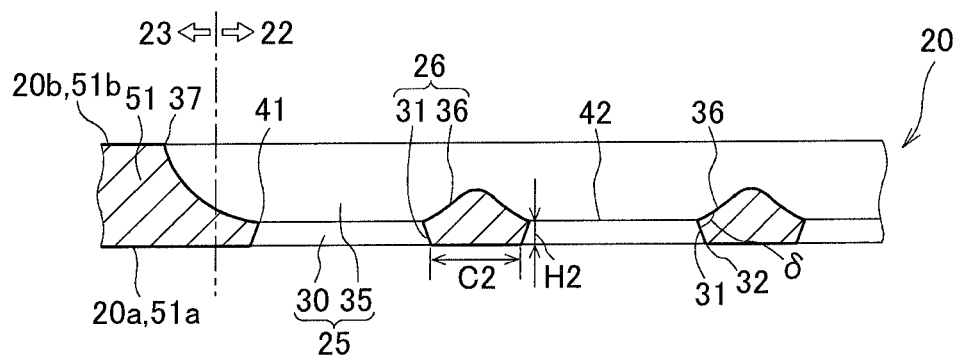
FIG. 6 is a cross-sectional view along the VI-VI line of FIG. 4A.
Figure 7:
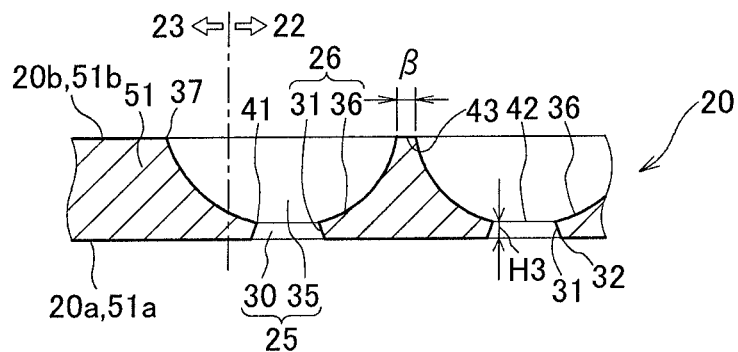
FIG. 7 is a cross-sectional view along the VII-VII line of FIG. 4A.

The effective area 22 will be described in detail below. FIG. 4A is a plan view of the effective area 22 of the deposition mask 20 when viewed from the first surface 20a side. FIG. 4B is a plan view of the effective area 22 of the deposition mask 20 when viewed from the second surface 20b side. In addition, FIGS. 5 to 7 are cross-sectional views along the V-V to VII-VII directions of the effective area 22 of FIG. 4A, respectively. Specifically, FIG. 5 is a cross-sectional view obtained when cutting the effective area 22 of the deposition mask 20 along a straight line that is orthogonal to the direction in which a later-described first portion 32a of a first end 32 of an opening 25 extends, and passes through the center part of the first portion 32a. Specifically, FIG. 6 is a cross-sectional view obtained when cutting the effective area 22 of the deposition mask 20 along a straight line that is orthogonal to the direction in which a later-described second portion 32b of the first end 32 of an opening 25 extends, and passes through the center part of the second portion 32b. In addition, FIG. 7 is a cross-sectional view obtained when cutting the effective area 22 of the deposition mask 20 along a straight line that passes through a joining portion at which the first portion 32a and the second portion 32b of an opening 25 are joined.

When the effective area 22 is viewed along the normal direction of the first surface 20a or second surface 20b of the deposition mask 20, at least some of a plurality of openings 25 are arranged at predetermined pitches along the first direction D1 and the second direction D2 which intersect each other. In the examples shown in FIGS. 4A and 4B, a plurality of openings are arranged at predetermined pitches along the first direction D1 and the second direction D2 which are orthogonal to each other. The first direction D1 may coincide with the length direction or the width direction of the deposition mask 20. The first direction D1 may be inclined with respect to the length direction or the width direction of the deposition mask 20. For example, the first direction D1 may be inclined with an angle of 45 degrees with respect to the length direction of the deposition mask 20.

As shown in FIGS. 5 to 7, a plurality of openings 25 penetrate from the first surface 20a to the second surface 20b. The first surface 20a is one surface and the second surface is the other surface in the normal direction N of deposition mask 20. Each opening 25 is defined by a wall surface 26 including a first end 32 that is an end located on the first surface 20a and a second end 37 that is an end located on the second surface 20b. The wall surface 26 extends from the first surface 20a to the second surface 20b.

The wall surface 26 of the opening 25 includes a first wall surface 31 located on the first surface 20a side and a second wall surface 36 located on the second surface 20b side. The first wall surface 31 is a surface that extends from the first end 32 of the opening 25 toward the second surface 20b. The second wall surface 36 is a surface that extends from a connection 41 toward the second surface 20b. The second wall surface 36 is connected to the first wall surface 31 via the connection 41. As described later, the deposition mask 20 is composed of a metal plate 51. The first wall surface 31 is a surface of a first recess 30 which is formed when etching the metal plate 51 from the first surface 51a. The second wall surface 36 is a surface of a second recess 35 which is formed when etching the metal plate 51 from the second surface 51b. The connection 41 is a part at which the first recess 30 and the second recess 35 are connected to each other.

At the connection 41, the direction in which the wall surface of an opening 25 extends changes. For example, the direction in which the wall surface extends changes discontinuously. An angle δ formed between the direction in which the first wall surface 31 extends at the connection 41 and the direction in which the second wall surface 36 extends at the connection 41 is, for example, 100 degrees or more.

As shown in FIGS. 5 to 7, the opening area of each second recess 35 on a cross-section along the plate surface of the deposition mask 20 gradually decreases from the second surface 20b toward the first surface 20a of the deposition mask 20 at locations along the normal direction N of the deposition mask 20. Similarly, the opening area of each first recess 30 on a cross-section along the plate surface of the deposition mask 20 may also gradually decreases from the first surface 20a side toward the second surface 20b of the deposition mask 20 at locations along the normal direction N of the deposition mask 20.

A wall surface 31 of the first recess 30 and a wall surface 36 of the second recess 35 are connected via a circumferential connection 41. The connection 41 is defined by a ridge at which the first wall surface 31 and the second wall surface 36 join each other. The part at which the first wall surface 31 and the second wall surface 36 join each other may protrude toward the center of an opening 25. At the connection 41, the first wall surface 31 may be inclined with respect to the normal direction N of the deposition mask 20. At the connection 41, the second wall surface 36 may be inclined with respect to the normal direction N of the deposition mask 20. In this embodiment, the opening area of an opening 25 is minimized at the connection 41 in plan view. Although not shown, the opening area of an opening 25 may be minimized at a location other than connection 41 in with the thickness direction of deposition mask 20

As shown in FIGS. 5 to 7, two adjacent openings 25 on the first surface 20a of the deposition mask 20 are spaced from each other along the planar direction of the first surface 20a of the deposition mask 20. Such openings 25 may be formed by etching a metal plate 51 such that the first surface 51a of the metal plate 51 remains between two adjacent first recesses 30 as in the production method described later. The first surface 51a of the metal plate 51 corresponds to the first surface 20a of the deposition mask 20.

Two adjacent openings 25 may be connected to each other on the second surface 20b of the deposition mask 20, or two adjacent openings 25 may be spaced from each other along the planar direction of the second surface 20b. Second recesses 35 of two adjacent openings 25 are connected to each other in the cross-sectional views shown in FIGS. 5 and 6. In other words, the second surface 51b of the metal plate 51 forming the deposition mask 20 does not remain between the two adjacent second recesses 35. Meanwhile, two adjacent openings 25 are spaced from each other along the planar direction of the second surface 20b in the cross-sectional view shown in FIG. 7. In other words, the second surface 51b of the metal plate 51 remains between the two adjacent second recesses 35. In the description below, a portion of the second surface 51b of the metal plate 51 located in an effective area 22, which is not etched and thus remains, is also referred to as "top portion 43".

By producing the deposition mask 20 such that such the top portion 43 remains, the deposition mask 20 can have a sufficient strength. This can suppress the deposition mask 20 from being damaged during transport, for example.

Incidentally, in the deposition step using the deposition mask 20, a deposition material 98 adheres to an organic EL substrate 92 through a second recess 35 whose opening area gradually decreases. One portion of the deposition material 98 moves from the crucible 94 to the organic EL substrate 92 along the normal direction N of the organic EL substrate 92. In FIG. 5, as indicated by an arrow from the second surface 20b to the first surface 20a, the other portion of the deposition material 98 may move in a direction inclined with respect to the normal direction N of the organic EL substrate 92. The portion of deposition material 98 moving in the inclined direction reaches and adheres to the second wall surface 36 of the second recess 35 before reaching the organic EL substrate 92 through the opening 25. As the proportion of the deposition material 98 that adheres to the second wall surface 36 of the second recess 35 increases, the utilization efficiency of the deposition material 98 in the deposition step decreases.

In FIG. 5, a minimum angle formed by a straight line K passing through the connection 41 and an arbitrary position on a second wall surface 36 of the second recess 35 along the normal direction N of the deposition mask 20 is represented by a reference sign θ1. In order to reduce the adhesion of a deposition material 98 moving diagonally to the second wall surface 36, the angle θ1 is preferably large. The angle θ1 is, for example, 30 degrees or more, preferably 45 degrees or more.

In order to increase the angle θ1, it is effective to decrease a width β of the above-described top portion 43. The width β of the top portion 43 shown in FIG. 7 is, for example, 10 μm or less, and may be 5 μm or less.

Although not shown, the deposition mask 20 may be configured such that no top portion 43 remains also in the cross-sectional view of FIG. 7. Alternatively, the deposition mask 20 may be configured such that the top portion 43 remains also in the cross-sectional views of FIGS. 5 and 6.

In addition, in order to increase the angle θ1, it is also effective to decrease a thickness T of the deposition mask 20. The thickness T of the deposition mask 20 is set to preferably 50 μm or less, for example, 5 μm or more and 50 μm or less. The thickness T of the deposition mask 20 may be 30 μm or less, 25 μm or less, 20 μm or less, 18 μm or less, 15 μm or less, or 13 μm or less. By reducing the thickness T of the deposition mask 20, it is possible to suppress the deposition material 98 from colliding with the first wall surface 31 of the first recess 30 or the second wall surface 36 of the second recess 35 in the deposition step. In addition, the thickness T of the deposition mask 20 may be 2 μm or more, 5 μm or more, 10 μm or more, or 15 μm or more. Here, the thickness T of the deposition mask 20 corresponds to the thickness of the peripheral area 23. In other words, the thickness T of the deposition mask 20 is a thickness of a portion of the deposition mask 20 where the first recess 30 and the second recess 35 are not formed. Therefore, the thickness T of the deposition mask 20 can be said as a thickness of the metal plate 51 of the deposition mask 20.

The range of the thickness T of the deposition mask 20 may be determined based on a combination of any of the plurality of lower limit candidate values described above and any of the plurality of upper limit candidate values described above. For example, it may be 2 μm or more and 50 μm or less, 5 μm or more and 30 μm or less, 10 μm or more and 25 μm or less, or 15 μm or more and 20 μm or less.

In addition, the range of the thickness T of the deposition mask 20 may be determined based on a combination of any two of the plurality of lower limit candidate values described above. For example, it may be 2 µm or more and 15 µm or less, 2 µm or more and 10 µm or less, 5 µm or more and 15 µm or less, or 5 µm or more and 10 µm or less. Further, the range of the thickness T of the deposition mask 20 may be determined based on a combination of any two of the plurality of upper limit candidate values described above. For example, it may be 20 µm or more and 50 µm or less, 20 µm or more and 30 µm or less, 25 µm or more and 50 µm or less, or 25 µm or more and 30 µm or less.

Incidentally, even in a case in which the deposition mask 20 is configured such that the above-described angle θ1 is sufficiently large, the deposition material 98 is unlikely to adhere to the organic EL substrate 92 in the vicinity of the first end 32 of the opening 25 due to shadow. For this reason, variations can occur in the thickness of the deposition layer 99 formed with the deposition material 98 adhering to the organic EL substrate 92. For example, the thickness of the deposition layer 99 located in the vicinity of the first end 32 of the opening 25 when viewed from the normal direction of the first surface 20a of the deposition mask 20 may be smaller than the thickness of the deposition layer 99 positioned at the center part of the opening 25. Such problems and means for solving the problems will be described in detail below with reference to FIGS. 8 to 10.

Figure 8:
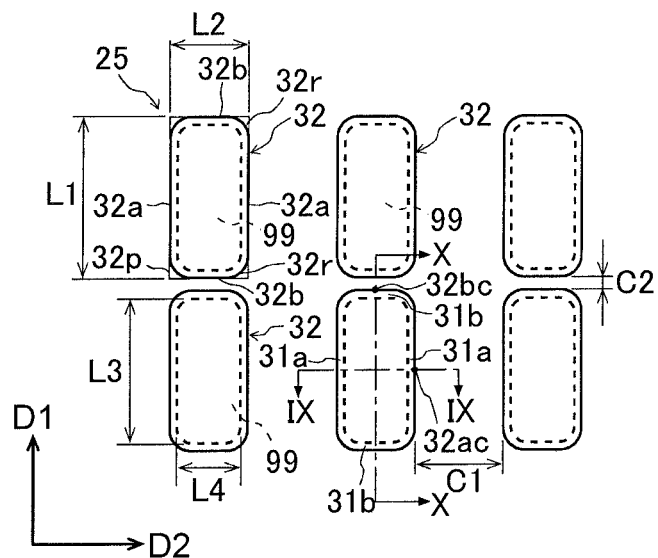
FIG. 8 is a plan view showing the first end of the opening of the deposition mask at an increased magnification.

FIG. 8 is a plan view showing the outlines of first ends 32 of a plurality of openings 25 of a deposition mask 20. In FIG. 8, the deposition layer 99 that is formed on the organic EL substrate 92 combined with the deposition mask 20 is virtually drawn by a dotted line.

In the deposition mask 20 of this embodiment, the first end 32 of the opening 25 includes a pair of first portions 32a that extend in the first direction D1 and a pair of second portions 32b that extend in the second direction D2 as shown in FIG. 8. As shown in FIG. 8, the first portion 32a has a first dimension L1, and the second portion 32b has a second dimension L2. The first dimension L1 is a dimension of the first portion 32a in the first direction D1. The second dimension L2 is a dimension of the second portion 32b in the second direction D2. As shown in FIG. 8, the second dimension L2 is shorter than the first dimension L1. In addition, in the example shown in FIG. 8, the first direction D1 and the second direction D2 are orthogonal to each other. Therefore, the outline of each first end 32 shown in FIG. 8 is a rectangular shape having the first portion 32a as the long side and the second portion 32b as the short side.

The difference between the first dimension L1 of the first portion 32a of the first end 32 and the second dimension L2 of the second portion 32b of the first end 32 is, for example, 2 µm or more, and it may be 4 µm or more, 6 µm or more, or 8 µm or more. In addition, the difference between the first dimension L1 of the first portion 32a of the first end 32 and the second dimension L2 of the second portion 32b of the first end 32 is, for example, 300 µm or less, and it may be 200 µm or less, 150 µm or less, or 100 µm or less.

The range of the difference between the first dimension L1 and the second dimension L2 may be determined based on a combination of any of the plurality of lower limit candidate values described above and any of the plurality of upper limit candidate values described above. For example, it may be 2 µm or more and 300 µm or less, 4 µm or more and 200 µm or less, 6 µm or more and 150 µm or less, or 8 µm or more and 100 µm or less. In addition, the range of the difference between the first dimension L1 and the second dimension L2 may be determined based on a combination of any two of the plurality of lower limit candidate values described above. For example, it may be 2 µm or more and 8 µm or less, 2 µm or more and 6 µm or less, 4 µm or more and 8 µm or less, or 4 µm or more and 6 µm or less. Further, the range of the difference between the first dimension L1 and the second dimension L2 may be determined based on a combination of any two of the plurality of upper limit candidate values described above. For example, it may be 100 µm or more and 300 µm or less, 100 µm or more and 200 µm or less, 150 µm or more and 300 µm or less, or 150 µm or more and 200 µm or less.

The first dimension L1 of the first portion 32a of the first end 32 is, for example, 17 µm or more, and it may be 22 µm or more, 27 µm or more, or 32 µm or more. In addition, the first dimension L1 of the first portion 32a of the first end 32 is, for example, 350 µm or less, and it may be 300 µm or less, 250 µm or less, or 200 µm or less. The second dimension L2 of the second portion 32b of the first end 32 is, for example, 15 µm or more, and it may be 20 µm or more, 25 µm or more, or 30 µm or more. In addition, the second dimension L2 of the second portion 32b of the first end 32 is, for example, 150 µm or less, and it may be 130 µm or less, 110 µm or less, or 100 µm or less.

The range of the first dimension L1 of the first portion 32a of the first end 32 may be determined based on a combination of any of the plurality of lower limit candidate values described above and any of the plurality of upper limit candidate values described above. For example, it may be 17 µm or more and 350 µm or less, 22 µm or more and 300 µm or less, 27 µm or more and 250 µm or less, or 32 µm or more and 200 µm or less. In addition, the range of the first dimension L1 of the first portion 32a of the first end 32 may be determined based on a combination of any two of the plurality of lower limit candidate values described above. For example, it may be 17 µm or more and 32 µm or less, 17 µm or more and 27 µm or less, 22 µm or more and 32 µm or less, or 22 µm or more and 27 µm or less. Further, the range of the first dimension L1 of the first portion 32a of the first end 32 may be determined based on a combination of any two of the plurality of upper limit candidate values described above. For example, it may be 200 µm or more and 350 µm or less, 200 µm or more and 300 µm or less, 250 µm or more and 350 µm or less, or 250 µm or more and 300 µm or less.

The range of the second dimension L2 of the second portion 32b of the first end 32 may be determined based on a combination of any of the plurality of lower limit candidate values described above and any of the plurality of upper limit candidate values described above. For example, it may be 15 µm or more and 150 µm or less, 20 µm or more and 130 µm or less, 25 µm or more and 110 µm or less, or 30 µm or more and 100 µm. In addition, the range of the second dimension L2 of the second portion 32b of the first end 32 may be determined based on a combination of any two of the plurality of lower limit candidate values described above. For example, it may be 15 µm or more and 30 µm or less, 15 µm or more and 25 µm or less, 20 µm or more and 30 µm or less, or 20 µm or more and 25 µm or less. Further, the range of the second dimension L2 of the second portion 32b of the first end 32 may be determined based on a combination of any two of the plurality of upper limit candidate values described above. For example, it may be 100 µm or more and 150 µm or less, 100 µm or more and 130 µm or less, 110 µm or more and 150 µm or less, or 110 µm or more and 130 µm or less.

In FIG. 8, a reference sign C1 represents an interval between first ends 32 of two openings 25 which are adjacent to each other such that first portions 32*a* face each other along the first direction D1. The interval C1 is also referred to as "first interval C1". In addition, a reference sign C2 represents an interval between first ends 32 of two openings 25 which are adjacent to each other such that second portions 32*b* face each other along the second direction D2. The interval C2 is also referred to as "second interval C2". The first interval C1 may be greater than the second interval C2. The difference between the first interval C1 and the second interval C2 is, for example, 0 µm or more, and it may be 2 µm or more, 5 µm or more, 10 µm or more, or 15 µm or more. In addition, the difference between the first interval C1 and the second interval C2 is, for example, 260 µm or less, and it may be 200 µm or less, 150 µm or less, 100 µm or less, 50 µm or less, 30 µm or less, or 20 µm or less.

The range of the difference between the first interval C1 and the second interval C2 may be determined based on a combination of any of the plurality of lower limit candidate values described above and any of the plurality of upper limit candidate values described above. For example, it may be 0 µm or more and 260 µm or less, 2 µm or more and 200 µm or less, 5 µm or more and 200 µm or less, 10 µm or more and 150 µm or less, 15 µm or more and 100 µm or less, 15 µm or more and 50 µm or less, 15 µm or more and 30 µm or less, or 15 µm or more and 20 µm or less. In addition, the range of the difference between the first interval C1 and the second interval C2 may be determined based on a combination of any two of the plurality of lower limit candidate values described above. For example, it may be 0 µm or more and 15 µm or less, 0 µm or more and 10 µm or less, 2 µm or more and 15 µm or less, 2 µm or more and 10 µm or less, 5 µm or more and 15 µm or less, or 5 µm or more and 10 µm or less. Further, the range of the difference between the first interval C1 and the second interval C2 may be determined based on a combination of any two of the plurality of upper limit candidate values described above. For example, it may be 20 µm or more and 250 µm or less, 30 µm or more and 250 µm or less, 50 µm or more and 250 µm or less, 100 µm or more and 250 µm or less, 100 µm or more and 200 µm or less, 150 µm or more and 260 µm or less, or 150 µm or more and 200 µm or less.

The first interval C1 is, for example, 30 µm or more, and it may be 35 µm or more, 40 µm or more, or 45 µm or more. In addition, the first interval C1 is, for example, 350 µm or less, and it may be 300 µm or less, 250 µm or less, or 200 µm or less. The second interval C2 is, for example, 15 µm or more, and it may be 20 µm or more, 25 µm or more, or 30 µm or more. In addition, the second interval C2 is, for example, 150 µm or less, and it may be 130 µm or less, 110 µm or less, or 100 µm or less.

The range of the first interval C1 may be determined based on a combination of any of the plurality of lower limit candidate values described above and any of the plurality of upper limit candidate values described above. For example, it may be 30 µm or more and 350 µm or less, 35 µm or more and 300 µm or less, 40 µm or more and 250 µm or less, or 45 µm or more and 200 µm or less. In addition, the range of the first interval C1 may be determined based on a combination of any two of the plurality of lower limit candidate values described above. For example, it may be 30 µm or more and 45 µm or less, 30 µm or more and 40 µm or less, 35 µm or more and 45 µm or less, or 35 µm or more and 40 µm or less. Further, the range of the first interval C1 may be determined based on a combination of any two of the plurality of upper limit candidate values described above. For example, it may be 200 µm or more and 350 µm or less, 200 µm or more and 300 µm or less, 250 µm or more and 350 µm or less, or 250 µm or more and 300 µm or less.

The range of the second interval C2 may be determined based on a combination of any of the plurality of lower limit candidate values described above and any of the plurality of upper limit candidate values described above. For example, it may be 15 µm or more and 150 µm or less, 20 µm or more and 130 µm or less, 25 µm or more and 110 µm or less, or 30 µm or more and 100 µm or less. In addition, the range of the second interval C2 may be determined based on a combination of any two of the plurality of lower limit candidate values described above. For example, it may be 15 µm or more and 30 µm or less, 15 µm or more and 25 µm or less, 20 µm or more and 30 µm or less, or 20 µm or more and 25 µm or less. In addition, the range of the second interval C2 may be determined based on a combination of any two of the plurality of upper limit candidate values described above. For example, it may be 100 µm or more and 150 µm or less, 100 µm or more and 130 µm or less, 110 µm or more and 150 µm or less, or 110 µm or more and 130 µm or less.

As shown in FIG. 8, the first end 32 may include a joining portion 32*r* at which the first portion 32*a* and the second portion 32*b* are joined. The joining portion 32*r* may extend in a direction different from the first direction D1 and the second direction D2. In the example shown in FIG. 8, the joining portion 32*r* has a curved shape. In a case in which the first end 32 includes the joining portion 32*r*, the dimension of the first portion 32*a* and the dimension of the second portion 32*b* are calculated based on the dimension of a side of a polygon circumscribing the first end 32. For example, the first dimension L1 of the first portion 32*a* includes a pair of sides that extend in the first direction D1 and a pair of sides that extend in the second direction D2, and corresponds to the length of a side of a quadrangle 32*p* circumscribing the first end 32 which extends in the first direction D1. In addition, the second dimension L2 of the second portion 32*b* corresponds to the length of a side of the above-described quadrangle 32*p* circumscribing the first end 32 which extends in the second direction D2.

In FIG. 8, a reference sign L3 represents the dimension of a deposition layer 99 in the first direction D1, and a reference sign L4 represents the dimension of a deposition layer 99 in the second direction D2. Since the adhesion of the deposition material 98 to the organic EL substrate 92 is suppressed in the vicinity of the first end 32 due to shadow, the outline of the deposition layer 99 may be smaller than the outline of the first end 32. For example, the dimension L3 of the deposition layer 99 in the first direction D1 may be smaller than the first dimension L1 of the first end 32 of the opening 25 of the deposition mask 20. Similarly, the dimension L4 of the deposition layer 99 in the first direction D2 may be smaller than the second dimension L2 of the first end 32 of the opening 25 of the deposition mask 20. Although not shown, the outline of the deposition layer 99 may be the same as the outline of the first end 32 or may be larger than the outline of the first end 32.

Figure 9:
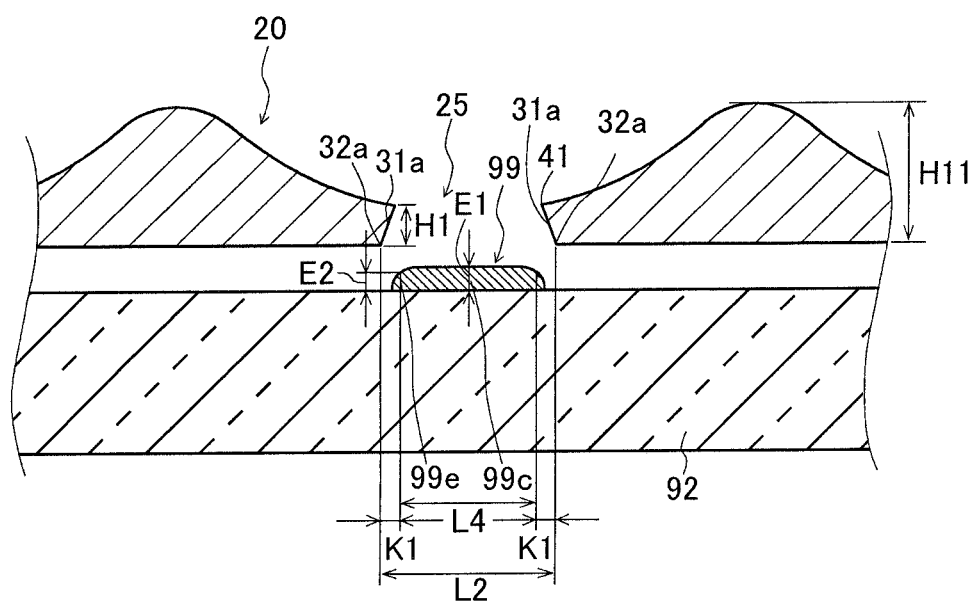
FIG. 9 is a cross-sectional view along the IX-IX line of FIG. 8.
Figure 10:
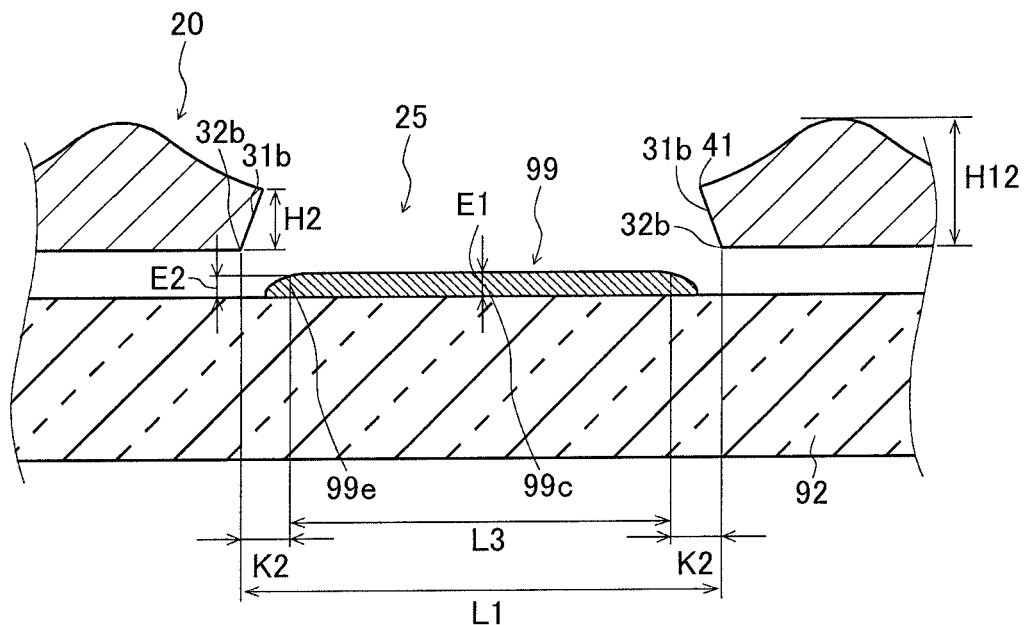
FIG. 10 is a cross-sectional view along the X-X line of FIG. 8.

FIGS. 9 and 10 show cross-sectional views along the IX-IX direction and the X-X direction of the effective area 22 in FIG. 8, respectively. Specifically, FIG. 9 shows a cross-sectional view obtained when cutting the effective area 22 of the deposition mask 20 along a straight line that is orthogonal to the first direction D1 in which the first portion 32*a* of the first end 32 extends, and passes through a center part 32*ac* of the first portion 32*a*. Specifically, FIG. 10 is a cross-sectional view obtained when cutting the effective area 22 of the deposition mask 20 along a straight line that is orthogonal to the second direction D2 in which the second portion 32b of the first end 32 extends, and passes through a center part 32bc of the second portion 32b.

FIGS. 9 and 10 show an example of a deposition layer 99 that is formed on an organic EL substrate 92 combined with the deposition mask 20. In FIGS. 9 and 10, a reference sign E1 represents the thickness of a center part 99c of the deposition layer 99 formed on the organic EL substrate 92, the center part overlapping the center of the opening 25 when viewed along the normal direction of the first surface 20a of the deposition mask 20. The thickness of a part of the deposition layer 99 located in the vicinity of the first end 32 of the opening 25 becomes smaller than the thickness E1 of the center part 99c due to shadow.

The deposition layer 99 preferably has a desired thickness in order to succeed in functioning desirably. For example, in a case in which the deposition layer 99 is a luminescent layer that emits light, a part of the deposition layer 99 which has a thickness equal to or greater than the desired thickness E2 can emit light when an operating voltage is applied thereto. In other words, a part of the deposition layer 99 which has a thickness smaller than E2 cannot emit light when an operating voltage is applied thereto. In the description below, a portion of the deposition layer 99 having a thickness E2, which is located closest to the first end 32 is also referred to as "effective edge 99e". In addition, the area of a portion of deposition layer 99 which is surrounded by the effective edge 99e is also referred to as "effective area".

As the pixel density of a display device such as an organic EL display device increases, the area assigned to one pixel decreases and the area of one opening 25 of the deposition mask 20 also decreases. In addition, the luminous intensity of the light emitted from the luminescent layer of one pixel is also reduced. In this case, as a method for increasing the luminous intensity of light, it is thought to increase the voltage applied to the luminescent layer. However, when the voltage is increased, the amount of heat generated increases and the reliability of the luminescent layer decreases. For example, the life of the luminescent layer is shortened.

In order to increase the luminous intensity of the light emitted from one luminescent layer under the condition that the area of the opening 25 is limited, it is preferable to increase the area of the electrode that applies a voltage to the deposition layer 99. In order to increase the area of the electrode, it is preferable to increase the effective area of the deposition layer 99 formed inside the first end 32 of the opening 25. As means for increasing the effective area of the deposition layer 99, it is thought to reduce the height of the wall surface 26 of the opening 25 to suppress the occurrence of shadow. However, when the height of the wall surface 26 is excessively decreased, the strength of the deposition mask 20 decreases, which is likely to cause damage or deformation of the deposition mask 20.

In consideration of such a problem, in this embodiment, it is proposed to make the height H1 of the first wall surface section 31a smaller than the height H2 of the second wall surface section 31b. The first wall surface section 31a is a portion of the first wall surface 31 of the wall surface 26 of the opening 25 which is connected to the first portion 32a of the first end 32 as shown in FIG. 9. The first wall surface section 31a extends from the first portion 32a toward the connection 41. As shown in FIG. 10, the second wall surface section 31b is a portion of the first wall surface 31 which is connected to the second portion 32b of the first end 32. The second wall surface section 31b extends from the second portion 32b toward the connection 41. By decreasing the height H1 of the first wall surface section 31a compared to the height H2 of the second wall surface section 31b, it is possible to increase the thickness of the deposition layer 99 in the vicinity of the first portion 32a of the first end 32 compared to the thickness of the deposition layer 99 in the vicinity of the second portion 32b of the first end 32. Therefore, as shown in FIGS. 9 and 10, it is possible to decrease the distance K1 between the first portion 32a of the first end 32 and the effective edge 99e of the deposition layer 99 in the planar direction of the deposition mask 20 compared to the distance K2 between the second portion 32b of the first end 32 and the effective edge 99e of the deposition layer 99 in the planar direction of the deposition mask 20.

In this embodiment, the first dimension L1 of the first portion 32a is greater than the second dimension L2 of the second portion 32b at the first end 32 of the opening 25 of the deposition mask 20. Therefore, the dimension L3 of a side of the deposition layer 99 which extends along the first portion 32a becomes greater than the dimension L4 of a side of the deposition layer 99 which extends along the second portion 32b. It is assumed herein that by decreasing the height of the first wall surface 31 of the opening 25 to suppress the occurrence of shadow, it is possible to decrease the separation distance K between the effective edge 99e and the first end 32 of the deposition layer 99 by ΔK. When a decrease in the separation distance K is achieved for the side of the deposition layer 99 which extends along the first portion 32a, the effective area of the deposition layer 99 increases by ΔK×L3×2. Meanwhile, when a decrease in the separation distance K is achieved for the side of the deposition layer 99 which extends along the second portion 32b, the effective area of the deposition layer 99 increases by ΔK×L4×2. As described above, the dimension L3 is greater than the dimension L4 in this embodiment. Accordingly, in order to increase the effective area of the deposition layer 99, it is advantageous to achieve a decrease in the separation distance K for a side of the deposition layer 99 which extends along the first portion 32a.

In this embodiment, the height H1 of the first wall surface section 31a is smaller than the height H2 of the second wall surface section 31b. Therefore, the distance K1 from the first portion 32a of the first end 32 to the effective edge 99e of the deposition layer 99 can be made smaller than that in a case in which the height H1 and the height H2 are equal. Accordingly, the effective area of the deposition layer 99 can be effectively increased. In addition, by increasing the height H2 compared to the height H1, it is possible to use a portion along the second portion 32b of the first end 32 of the deposition mask 20 as a portion for securing the strength of the deposition mask 20. Thus, it is possible to suppress the deformation or damage of the deposition mask 20 while increasing the effective area of the deposition layer 99.

The difference between the height H1 and the height H2 is, for example, 1 μm or more, and it may be 1.5 μm or more, 2 μm or more, or 2.5 μm or more. In addition, the difference between the height H1 and the height H2 is, for example, 10 μm or less, and it may be 8 μm or less, 6 μm or less, or 4 μm or less.

The range of the difference between the height H1 and the height H2 may be determined based on a combination of any of the plurality of lower limit candidate values described above and any of the plurality of upper limit candidate values described above. For example, it may be 1 μm or more and 10 μm or less, 1.5 μm or more and 8 μm or less, 2 μm or more and 6 μm or less, or 2.5 μm or more and 4 μm or less. In addition, the range of the difference between the height H1 and the height H2 may be determined based on a combination of any two of the plurality of lower limit candidate values described above. For example, it may be 1 µm or more and 2.5 µm or less, 1 µm or more and 2 µm or less, 1.5 µm or more and 2.5 µm or less, or 1.5 µm or more and 2 µm or less. Further, the range of the difference between the height H1 and the height H2 may be determined based on a combination of any two of the plurality of upper limit candidate values described above. For example, it may be 4 µm or more and 10 µm or less, 4 µm or more and 8 µm or less, 6 µm or more and 10 µm or less, or 6 µm or more and 8 µm or less.

The height H1 is, for example, 0 µm or more, and it may be 0.5 µm or more, 1 µm or more, or 1.5 µm or more. In addition, the height H1 is, for example, 5 µm or less, and it may be 4 µm or less, 3.5 µm or less, or 3 µm or less. The height H2 is, for example, 1 µm or more, and it may be 1.5 µm or more, 2 µm or more, or 2.5 µm or more. Further, the height H2 is, for example, 10 µm or less, and it may be 8 µm or less, 6 µm or more, or 5 µm or more.

The range of the height H1 may be determined based on a combination of any of the plurality of lower limit candidate values described above and any of the plurality of upper limit candidate values described above. For example, it may be 0 µm or more and 5 µm or less, 0.5 µm or more and 4 µm or less, 1 µm or more and 3.5 µm or less, or 1.5 µm or more and 3 µm or less. In addition, the range of the height H1 may be determined based on a combination of any two of the plurality of lower limit candidate values described above. For example, it may be 0 µm or more and 1.5 µm or less, 0 µm or more and 1 µm or less, 0.5 µm or more and 1.5 µm or less, or 0.5 µm or more and 1 µm or less. Further, the range of the height H1 may be determined based on a combination of any two of the plurality of upper limit candidate values described above. For example, it may be 3 µm or more and 5 µm or less, 3 µm or more and 4 µm or less, 3.5 µm or more and 5 µm or less, 3.5 µm or more and 4 µm or less.

The range of the height H2 may be determined based on a combination of any of the plurality of lower limit candidate values described above and any of the plurality of upper limit candidate values described above. For example, it may be 1 µm or more and 10 µm or less, 1.5 µm or more and 8 µm or less, 2 µm or more and 6 µm or less, or 2.5 µm or more and 5 µm or less. In addition, the range of the height H2 may be determined based on a combination of any two of the plurality of lower limit candidate values described above. For example, it may be 1 µm or more and 2.5 µm or less, 1 µm or more and 2 µm or less, 1.5 µm or more and 2.5 µm or less, or 1.5 µm or more and 2 µm or less. Further, the range of the height H2 may be determined based on a combination of any two of the plurality of upper limit candidate values described above. For example, it may be 5 µm or more and 10 µm or less, 5 µm or more and 8 µm or less, 6 µm or more and 10 µm or less, or 6 µm or more and 8 µm or less.

Figure 11:
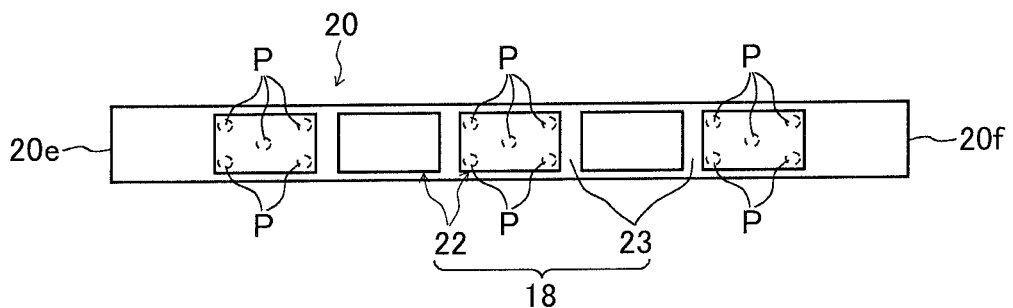
FIG. 11 is a plan view explaining a method for measuring the height of the first wall surface of the opening of the deposition mask.

A method for measuring the heights H1 and H2 will be described below. Here, as shown in FIG. 11, a case in which a plurality of effective areas 22 are arranged along the length direction of the deposition mask 20 will be described. First, a sample 20s for measuring the heights H1 and H2 is extracted at a plurality of examination points P in each effective area 22 of the deposition mask 20. For example, as shown in FIG. 11, first and second samples are extracted at a plurality of examination points P in the effective area 22 located closest to the first end portion 20e among a plurality of effective areas 22 arranged in the length direction of the deposition mask 20. The first sample is a sample for measuring the height H1. The second sample is a sample for measuring the height H2. In addition, first and second samples are extracted at a plurality of examination points P in an effective area 22 located closest to a second end portion 20f among the plurality of effective areas 22 arranged in the length direction of the deposition mask 20. In addition, first and second samples are extracted at the plurality of examination points P in the effective area 22 located between the effective area 22 closest to the first end portion 20e and the effective area 22 closest to the second end portion 20f among the plurality of effective areas 22. In a case in which an even number of effective areas 22 are arranged in the length direction of the deposition mask 20, first and second samples are extracted at the plurality of examination points P in either one of the effective area 22 closest to the first end portion 20e and the effective area 22 closest to the second end portion 20f. In a case in which an effective area 22 is a polygon such as a quadrangle, a plurality of examination points P in one effective area 22 are set to be in the vicinity of each corner of the polygonal effective area 22 and the center part of the effective area 22, for example.

Figure 12:
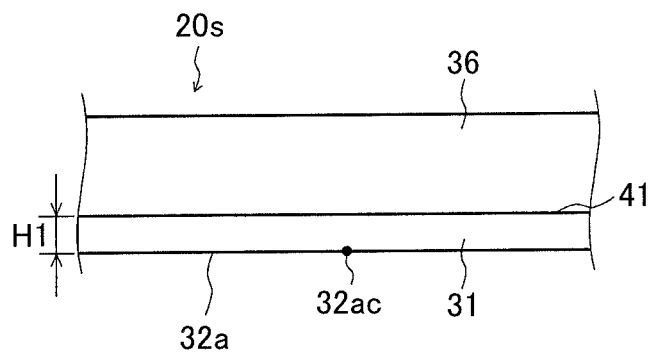
FIG. 12 is a plan view explaining a method for measuring the height of the first wall surface of the opening of the deposition mask.

FIG. 12 is a side view showing the first wall surface 31 and the second wall surface 36 of the first sample 20s for measuring the height H1. The first sample 20s in FIG. 12 can be obtained by, for example, cutting the deposition mask 20 along a cutting line passing through a pair of second portions 32b as shown in FIG. 4A. The side view of FIG. 12 can be obtained by, for example, observing the first wall surface section 31a of the first sample 20s along the direction of arrow A with a scanning electron microscope as shown in FIG. 4A. The height H1 of the first wall surface 31 of the first sample 20s corresponds to the height of the first wall surface 31 at the center part 32ac of the first portion 32a of the first end 32. FlexSEM 1000 manufactured by Hitachi High-Technologies can be used as a scanning electron microscope for observing the first wall surface 31 of the first sample 20s. The magnification at the time of observation is 5,000 times.

First, a first sample 20s is placed on a sample stage in the observation step using a scanning electron microscope. At such time, the first sample 20s is placed such that the first wall surface 31 and the second wall surface 36 of the first sample 20s are visible when viewed from the normal direction of the surface of the sample stage. Next, the first sample 20s is observed using the scanning electron microscope. In addition, during observation, the angle of the scanning electron microscope with respect to the first sample 20s is adjusted such that the first surface 20a and the second surface 20b of the first sample 20s become invisible. The position of the center part 32ac of the first portion 32a for the first sample 20s is identified. By observing the first sample 20s at a magnification of 5,000 times, the height H1 of the first wall surface 31 is measured using a dimensional measurement function of the scanning electron microscope, so-called length measurement.

For a plurality of first samples 20s, the height H1 of the first wall surface section 31a of the first wall surface 31 is measured based on the above-described method. Subsequently, the average value of the heights H1 of the first wall surface sections 31a of the first wall surfaces 31 of the plurality of first samples 20s is calculated. This average value is used as the height H1 of the first wall surface section 31a.

The height H2 of the second wall surface section 31b is calculated by the same method as in the height H1. For example, a second sample can be obtained by cutting the deposition mask 20 along a cutting line passing through a pair of first portions 32a as shown in FIG. 4A. The height H2 is measured by microscopically observing the second wall surface section 31*b* of the second portion 32*b* of the second sample along the direction of arrow B. In addition, the average value of the heights H2 of the first wall surfaces 31 of the plurality of samples is calculated.

In FIG. 9, a reference sign H11 represents the height of the entire wall surface of a portion to be connected to the center part 32*ac* of the first portion 32*a* of a first end 32, which is included in the wall surface of an opening 25. The height H11 is also referred to as "first height". The first height H11 corresponds to the height of the wall surface of the opening 25 in a cross-section of the deposition mask 20 which includes the center part 32*ac* of the first portion 32*a* and is orthogonal to the first direction D1. In FIG. 10, a reference sign H12 represents the height of the entire wall surface of a portion to be connected to the center part 32*bc* of a second portion 32*b* of the first end 32, which is included in the wall surface of an opening 25. The height H12 is also referred to as "second height". The second height H12 corresponds to the height of the wall surface of an opening 25 in a cross-section of the deposition mask 20 which includes the center part 32*bc* of the second portion 32*b* and is orthogonal to the second direction D2. Preferably, each of the heights H11 and H12 is smaller than the thickness T of the deposition mask 20. The heights H11 and H12 are, for example, 1×T or less, and they may be 0.9×T or less, 0.8×T or less, or 0.7×T or less. In addition, the heights H11 and H12 are, for example, 0.3×T or more, and they may be 0.4×T or more, 0.5×T or more, or 0.6×T or more.

The ranges of the heights H11 and H12 may be determined based on a combination of any of the plurality of lower limit candidate values described above and any of the plurality of upper limit candidate values described above. For example, they may be 0.3×T or more and 1×T or less, 0.4×T or more and 0.9×T or less, 0.5×T or more and 0.8×T or less, or 0.6×T or more and 0.7×T or less. In addition, the ranges of the heights H11 and H12 may be determined based on a combination of any two of the plurality of lower limit candidate values described above. For example, they may be 0.3×T or more and 0.6×T or less, 0.3×T or more and 0.5×T or less, 0.4×T or more and 0.6×T or less, or 0.4×T or more and 0.5×T or less. Further, the ranges of the heights H11 and H12 may be determined based on a combination of any two of the plurality of upper limit candidate values described above. For example, they may be 0.7×T or more and 1×T or less, 0.7×T or more and 0.9×T or less, 0.8×T or more and 1×T or less, or 0.8×T or more and 0.9×T or less.

Figure 13:
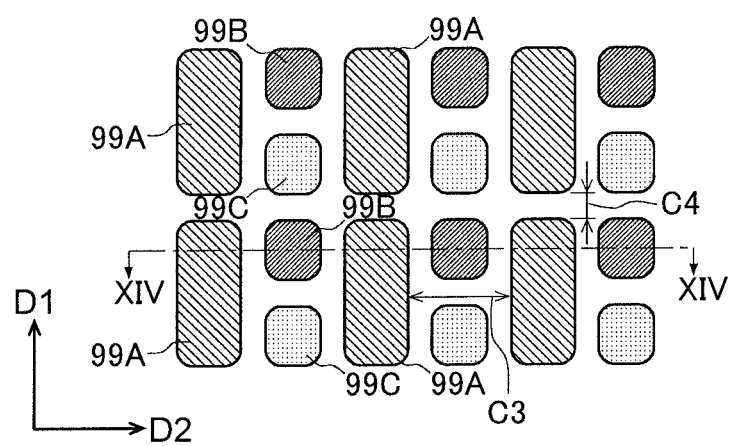
FIG. 13 is a plan view showing an example of an organic EL display device.

An example of an organic EL display device 100 including a deposition layer having sides with different lengths will be described with reference to FIGS. 13 and 14. FIG. 13 is a plan view showing the organic EL display device 100 when viewed from the deposition layer side.

The organic EL display device 100 comprises a first deposition layer 99A that emits light of a first color, a second deposition layer 99B that emits light of a second color, and a third deposition layer 99C that emits light of a third color. The first deposition layer 99A shown in FIG. 13 is a deposition layer having sides with different lengths which is formed by the deposition mask 20 according to this embodiment. There is the second deposition layer 99B or the third deposition layer 99C between the long sides of two first deposition layer 99A that are adjacent to each other in a direction orthogonal to the first direction D1. Meanwhile, there is neither the second deposition layer 99B nor the third deposition layer 99C between the short sides of two first deposition layer 99A that are adjacent to each other in a direction orthogonal to the second direction D2. Thus, the interval C3 between the long sides of two first deposition layers 99A is larger than the interval C4 between the short sides of two first deposition layers 99A. In FIG. 13, portions of deposition layers 99A, 99B, and 99C overlapping an electrode are illustrated.

The first color, the second color, and the third color are, for example, blue color, green color, and red color, respectively. An organic material forming a deposited layer that emits blue light has a shorter life than organic materials for green and red colors. Therefore, if the area of a deposition layer and the voltage applied to the deposition layer are the same, the organic material for blue color deteriorates the fastest. In view of this problem, as shown in FIG. 13, it is preferable to set the area of the first deposition layer 99A that emits blue right to be larger than the area of the second deposition layer 99B for green color and the area of the third deposition layer 99C for red color. In the example shown in FIG. 13, the area of the first deposition layer 99A is expanded by setting the length of a pair of sides of the first deposition layer 99A that emits blue light to be greater than the length of the other pair of sides.

Figure 14:
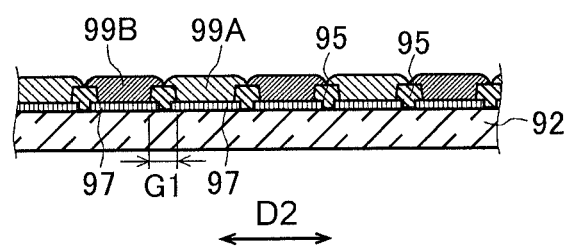
FIG. 14 is a cross-sectional view along the XIV-XIV of FIG. 13.

FIG. 14 shows a cross-sectional view along the XIV-XIV of FIG. 13. As shown in FIG. 14, a pixel divided layer (PDL) 95 may be provided between the first deposition layer 99A and the second deposition layer 99B that are adjacent to each other. The pixel divided layer 95 is a layer for defining the shape of an electrode 97 that functions in each pixel. The width G1 of the pixel divided layer 95 is determined based on the manufacturing tolerance of the position and shape of the opening 25 of the deposition mask 20.

Figure 15:
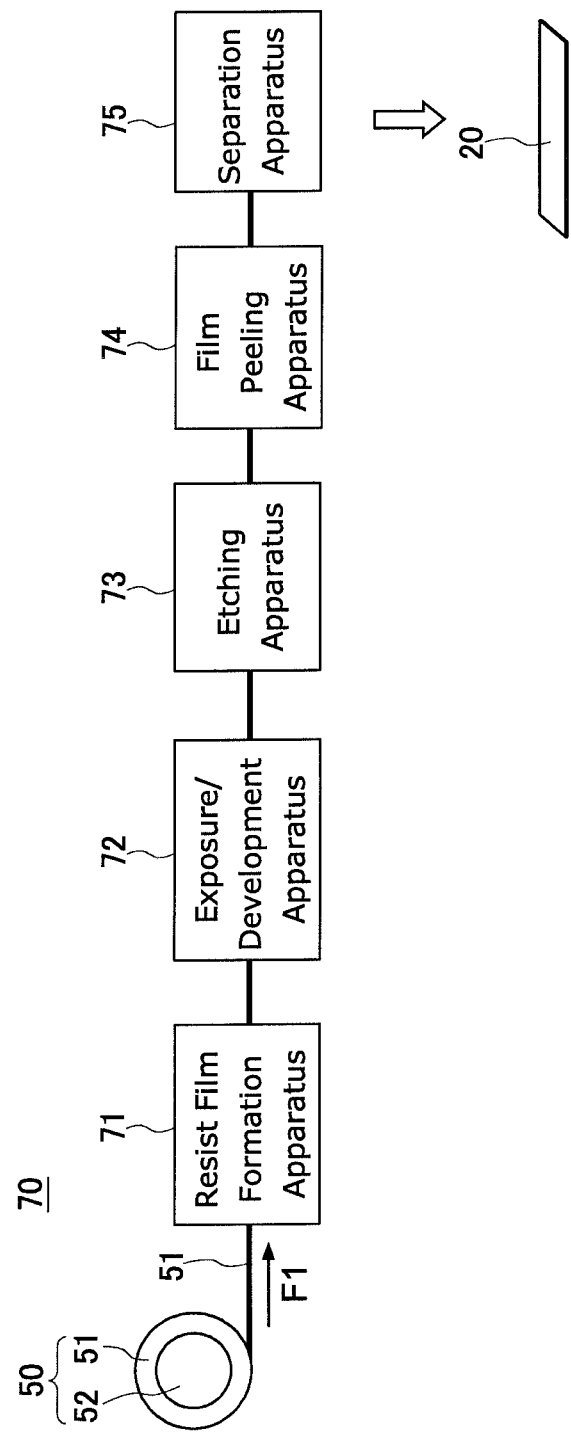
FIG. 15 is a schematic view for generally explaining an example of a production method of the deposition mask.

Next, a method for producing the deposition mask 20 by processing the metal plate 51 will be described mainly with reference to FIGS. 15 to 20. FIG. 15 shows a production apparatus 70 for producing the deposition mask 20 using the metal plate 51. First, a winding body 50 including the metal plate 51 wound around the shaft member 52 is prepared. Next, the metal plate 51 of the winding body 50 is unwound from the shaft member 52, and the metal plate 51 is sequentially conveyed to a resist film formation apparatus 71, an exposure/development apparatus 72, an etching apparatus 73, a film peeling apparatus 74, and a separation apparatus 75 shown in FIG. 15. FIG. 15 shows an example in which the metal plate 51 is conveyed in its length direction F1 so as to be moved between the apparatuses, which however is not restrictive. For example, a metal plate 51 on which a resist film has been formed by the resist film formation apparatus 71 may be rewound around the shaft member 52, and then, the metal plate 51 in the winding body state may be supplied to the exposure/development apparatus 72. A metal plate 51 on which a resist film treated by the exposure/development process by the exposure/development apparatus 72 has been formed may be rewound around the shaft member 52, and then, the metal plate 51 in the winding body state may be supplied to the etching apparatus 73. A metal plate 51 that has been etched by the etching apparatus 73 may be rewound around the shaft member 52, and then, the metal plate 51 in the winding body state may be supplied to the film peeling apparatus 74. A metal plate 51 from which a resin 54 or the like described later has been removed by the film peeling apparatus 74 may be rewound around the shaft member 52, and then, the metal plate 51 in the winding body state may be supplied to the separation apparatus 75.

The resist film formation apparatus 71 provides a resist film on the metal plate 51. The exposure/development apparatus 72 performs the exposure process and the development process on the resist film so as to pattern a resist film, thereby forming a resist pattern.

The etching apparatus 73 performs etching on the metal plate 51 using the resist pattern as a mask, thereby forming openings 25 on the metal plate 51. In this embodiment, many openings 25 corresponding to a plurality of deposition masks 20 are formed on the metal plate 51. In other words, a plurality of deposition masks 20 are assigned to the metal plate 51. For example, many openings 25 are formed on the metal plate 51 such that a plurality of effective areas 22 are arranged in the width direction F2 of the metal plate 51, and effective areas 22 for a plurality of deposition masks 20 are arranged in the length direction F1 of the metal plate 51. The film peeling apparatus 74 allows a component such as a resist pattern or a resin 54 described later, which is provided to protect a non-etched area of the metal plate 51 from an etching solution, to be peeled off.

The separation apparatus 75 performs the separation step of separating a portion of the metal plate 51, on which a plurality of openings 25 corresponding to a single deposition mask 20 are formed, from the metal plate 51. Accordingly, the deposition mask 20 can be obtained.

Each step of the production method of a deposition mask 20 will be described in detail below.

First, a winding body 50 including the metal plate 51 wound around the shaft member 52 is prepared. For example, a metal plate made of an iron alloy containing nickel is used as the metal plate 51. The thickness of the metal plate 51 is, for example, 5 μm or more and 50 μm or less. As a production for the metal plate 51 having a desired thickness, a rolling method, a plating film formation method, or the like can be adopted.

Figure 16:
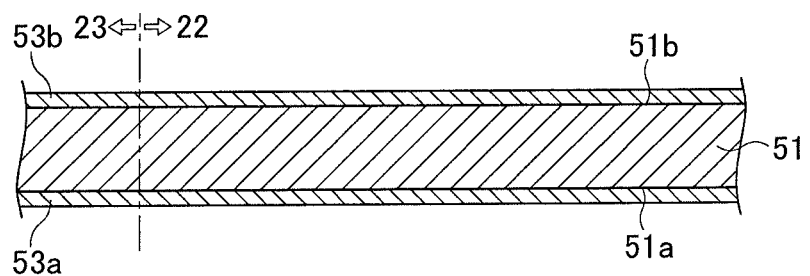
FIG. 16 is a view depicting a step of forming a resist film on a metal plate.

Next, resist films 53a, 53b are formed on the first surface 51a and the second surface 51b of the metal plate 51 unwound by an unwinding apparatus using the resist film formation apparatus 71 as shown in FIG. 16. For example, resist films 53a, 53b are formed by attaching a dry film containing a photosensitive resist material such as an acrylic photocurable resin to the first surface 51a and the second surface 51b of the metal plate 51. Alternatively, resist films 53a, 53b may be formed by applying a coating liquid containing a negative photosensitive resist material to the first surface 51a and the second surface 51b of the metal plate 51 and drying the coating liquid. The thickness of resist films 53a, 53b is, for example, 15 μm or less, and it may be 10 μm or less, 6 μm or less, or 4 μm or less. In addition, the thickness of resist films 53a, 53b is, for example, 1 μm or more, and it may be 3 μm or more, 5 μm or more, or 7 μm or more. The range of the thickness T of resist films 53a, 53b may be determined based on a combination of any of the plurality of upper limit candidate values described above and any of the plurality of lower limit candidate values described above. In addition, range of the thickness T of resist films 53a, 53b may be determined based on a combination of any two of the plurality of upper limit candidate values described above. Further, range of the thickness T of resist films 53a, 53b may be determined based on a combination of any two of the plurality of lower limit candidate values described above.

Figure 17:
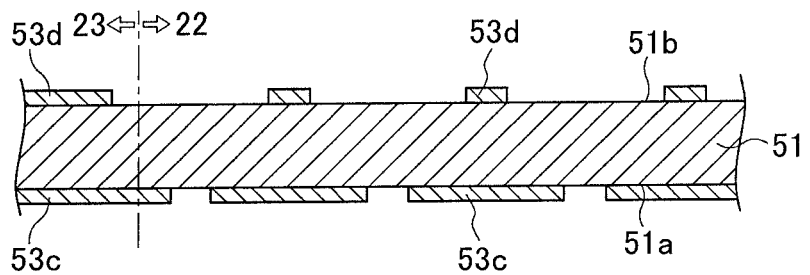
FIG. 17 is a view depicting a step of patterning a resist film.

Next, exposure and development of resist films 53a, 53b are performed using the exposure/development apparatus 72. Accordingly, as shown in FIG. 17, it is possible to form a first resist pattern 53c on the first surface 51a of a metal plate 51 and a second resist pattern 53d on the second surface 51b of a metal plate 51.

Subsequently, the etching step of etching the metal plate 51 with resist patterns 53c, 53d as masks is performed using the etching apparatus 73. The etching step includes a first surface etching step and a second surface etching step.

Figure 18:
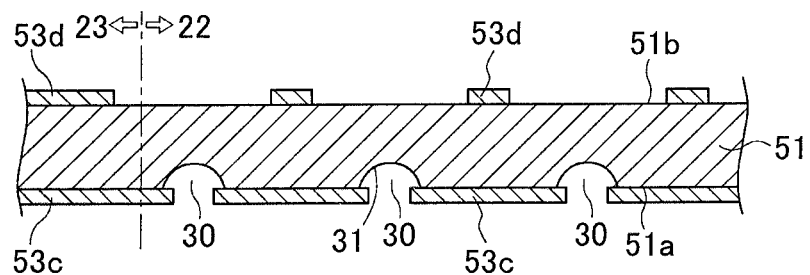
FIG. 18 is a view depicting a first surface etching step.

First, as shown in FIG. 18, the first surface etching step is performed. In the first surface etching step, an area of the first surface 51a of the metal plate 51 which is not covered with the first resist pattern 53c is etched using a first etching solution. For example, the first etching solution is sprayed from a nozzle arranged so as to face the first surface 51a of the metal plate 51 to be conveyed toward the first surface 51a of the metal plate 51 through the first resist pattern 53c. At such time, the second surface 51b of the metal plate 51 may be covered with a film having resistance to the first etching solution.

As a result of the first surface etching step, as shown in FIG. 18, the erosion by the first etching solution proceeds in the area of the metal plate 51 which is not covered with the first resist pattern 53c. Accordingly, many first recesses 30 are formed on the first surface 51a of the metal plate 51. For example, a ferric chloride solution and a solution containing hydrochloric acid are used as the first etching solution.

Figure 19:
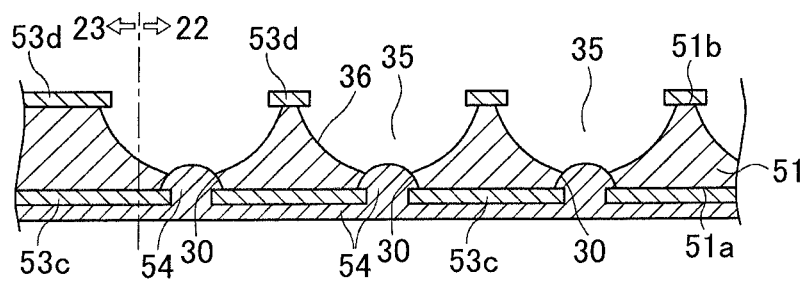
FIG. 19 is a view depicting a second surface etching step

Next, as shown in FIG. 19, the second surface etching step is performed. In the second surface etching step, an area of the second surface 51b of the metal plate 51 which is not covered with the second resist pattern 53d is etched using a second etching solution. Accordingly, second recesses 35 are formed on the second surface 51b of the metal plate 51. Etching of the second surface 51b is performed until the first recesses 30 and the second recesses 35 communicate with each other, thereby forming openings 25. For example, a ferric chloride solution and a solution containing hydrochloric acid are used as the second etching solution as with the above-described first etching solution. As shown in FIG. 19, the first recessed 30 may be covered with a resin 54 having resistance to the second etching solution during etching of the second surface 51b.

Figure 20:
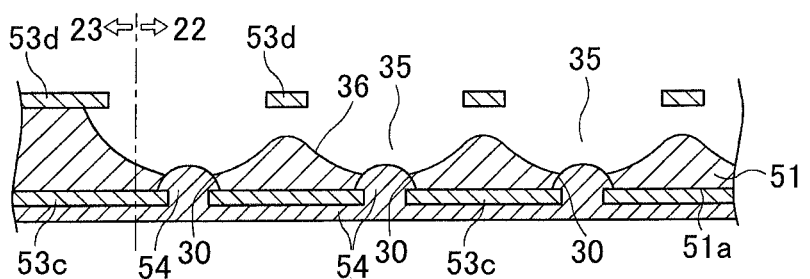
FIG. 20 is a view depicting a second surface etching step

In the second surface etching step, etching may proceed until two adjacent second recesses 35 are connected to each other as shown in FIG. 20. At a site where two adjacent second recesses 35 are connected to each other, the second resist pattern 53d is peeled off from the metal plate 51. As shown in FIG. 7 above, the second surface 20b may partially remain between two adjacent second recesses 35.

Figure 21:
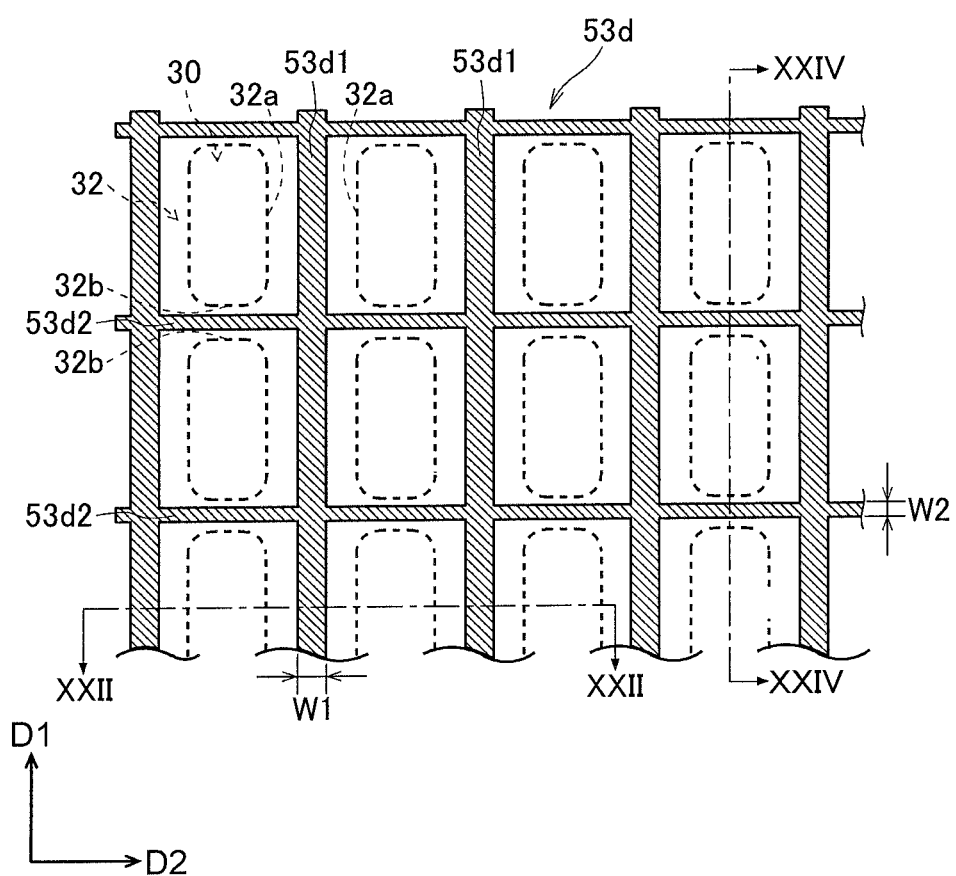
FIG. 21 is a plan view illustrating a second resist pattern formed on a second surface of a metal plate.

The second surface etching step will be described in detail with reference to FIGS. 21 to 25. FIG. 21 is a plan view illustrating the second resist pattern formed on the second surface of the metal plate 51. In FIG. 21, the first end 32 of each first recess 30 formed by the first surface etching step is shown by a dotted line.

As shown in FIG. 21, the second resist pattern 53d includes a first portion 53d1 that extends in the first direction D1 and a second portion 53d2 that extends in the second direction D2. The first portion 53d1 extends along the first portion 32a of the first end 32 when the second resist pattern 53d is viewed along the normal direction of the second surface 20b. The first portion 53d1 is located between first portions 32a of two adjacent first recesses 30. The first portions 32a of two adjacent first recesses 30 face each other in a direction orthogonal to the first direction D1. The second portion 53d2 extends in the second portion 32b of the first end 32 when the second resist pattern 53d is viewed along the normal direction of the second surface 20b. The second portion 53d2 is located between second portions 32b of two adjacent first recesses 30. The second portions 32b of two adjacent first recesses 30 face each other in a direction orthogonal to the second direction D2. The width W1 of the first portion 53d1 of the second resist pattern 53d is greater than the width W2 of the second portion 53d2. The width W1 of the first portion 53d1 is also referred to as "first width". The width W2 of the second portion 53d2 is also referred to as "second width".

The difference between the first width W1 and the second width W2 is, for example, 0.5 μm or more, and it may be 2 μm or more, 5 μm or more, 10 μm or more, or 15 μm or more. In addition, the difference between the first width W1 and the second width W2 is, for example, 260 μm or less, and it may be 200 μm or less, 150 μm or less, 100 μm or less, 50 μm or less, 30 μm or less, or 20 μm or less.

The range of the difference between the first width W1 and the second width W2 may be determined based on a combination of any of the plurality of lower limit candidate values described above and any of the plurality of upper limit candidate values described above. For example, it may be 0.5 μm or more and 260 μm or less, 2 μm or more and 200 μm or less, 5 μm or more and 200 μm or less, 10 μm or more and 150 μm or less, 15 μm or more and 100 μm or less, 15 μm or more and 50 μm or less, 15 μm or more and 30 μm or less, or 15 μm or more and 20 μm or less. In addition, the range of the difference between the first width W1 and the second width W2 may be determined based on a combination of any two of the plurality of lower limit candidate values described above. For example, it may be 0.5 μm or more and 15 μm or less, 0.5 μm or more and 10 μm or less, 2 μm or more and 15 μm or less, 2 μm or more and 10 μm or less, 5 μm or more and 15 μm or less, or 5 μm or more and 10 μm or less. Further, the range of the difference between the first width W1 and the second width W2 may be determined based on a combination of any two of the plurality of upper limit candidate values described above. For example, it may be 20 μm or more and 250 μm or less, 30 μm or more and 250 μm or less, 50 μm or more and 250 μm or less, 100 μm or more and 250 μm or less, 100 μm or more and 200 μm or less, 150 μm or more and 260 μm or less, or 150 μm or more and 200 μm or less.

Figure 22:
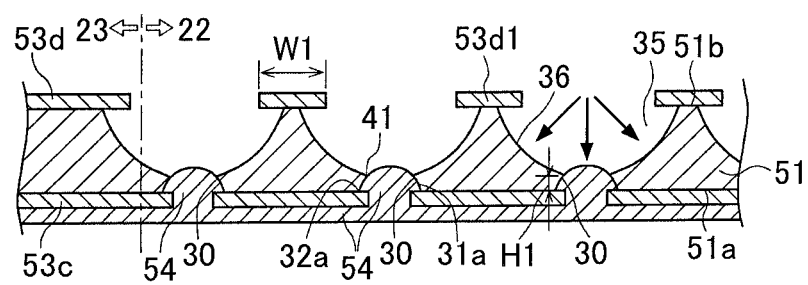
FIG. 22 is a cross-sectional view depicting a second surface etching step that proceeds in a space between first portions of a second resist pattern of a metal plate.
Figure 23:
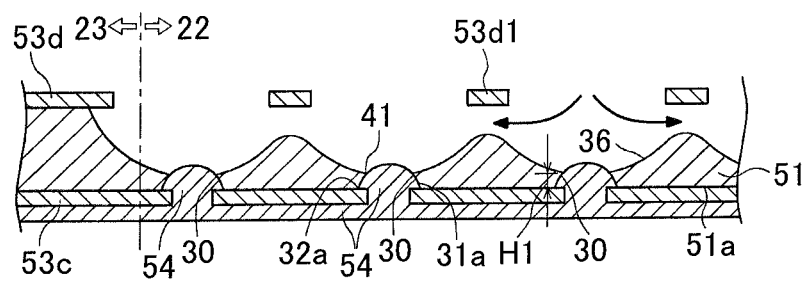
FIG. 23 is a cross-sectional view depicting a second surface etching step that proceeds in a space between first portions of a second resist pattern of a metal plate.

Next, how the second surface etching step proceeds will be described in detail. First, the second surface etching step that proceeds between first portions 53d1 of the second resist pattern 53d of the metal plate 51 will be described. FIGS. 22 and 23 show the second surface etching step that proceeds on a cross-section along the XXII-XXII line on the metal plate 51 shown in FIG. 21.

As shown by the arrow in FIG. 22, etching of the metal plate 51 on the second surface 51b proceeds isotropically in various directions. As a result, the second recess 35 having a curved second wall surface 36 is formed on the second surface 51b of the metal plate 51. When etching proceeds in the thickness direction of the metal plate 51 and thus the second recess 35 communicates with the first recess 30, a connection 41 is formed between the first wall surface 31 of the first recess 30 and the second wall surface 36 of the second recess 35. After the second recess 35 communicates with the first recess 30, when etching further proceeds in the thickness direction of the metal plate 51, the position of the connection 41 is displaced to the first surface 51a side. When the position of the connection 41 is displaced to the first surface 51a side, the height H1 of the first wall surface section 31a decreases.

Incidentally, when etching proceeds in the planar direction of the metal plate 51 and thus two adjacent second recesses 35 are connected to each other as shown in FIG. 23, at least a portion of the second wall surface 36 of the second recess 35 is separated from the first portion 53d1 of the second resist pattern 53d. For example, a portion of the second wall surface 36 located between the center parts 32ac of the two first recesses 30 that are adjacent to each other in plan view is separated from the first portion 53d1. As a result, a gap is formed between the first portion 53d1 of the second resist pattern 53d and the metal plate 51. Subsequently, a flow along the planar direction of the second surface 51b of the metal plate 51, which passes between the first portion 53d1 of the second resist pattern 53d and the metal plate 51, is generated in the second etching solution as shown by the arrow in FIG. 23. When the flow along the planar direction of the second surface 51b is generated in the second etching solution, the flow or circulation of the second etching solution is unlikely to be generated in a direction other than the planar direction of the second surface 51b. As a result, for example, etching in the thickness direction of the metal plate 51 is suppressed from proceeding. Therefore, after the flow along the planar direction of the second surface 51b is generated in the second etching solution, the height H1 of the first wall surface 31 of the first recess 30 is unlikely to decrease.

Figure 24:
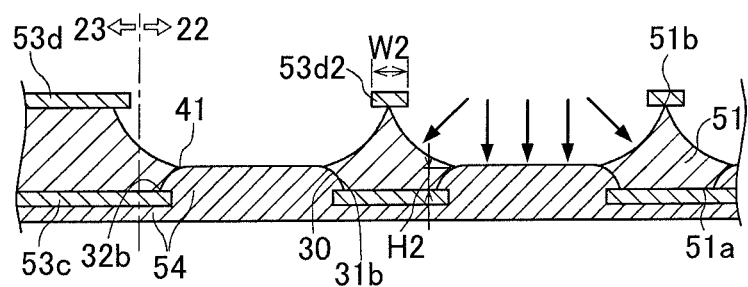
FIG. 24 is a cross-sectional view depicting a second surface etching step that proceeds in a space between second portions of a second resist pattern of a metal plate.
Figure 25:
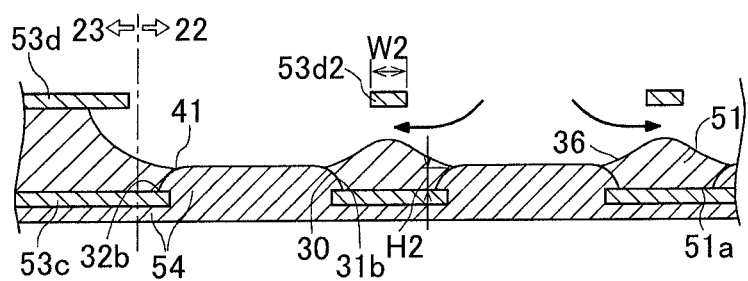
FIG. 25 is a cross-sectional view depicting a second surface etching step that proceeds in a space between second portions of a second resist pattern of a metal plate.

Next, the second surface etching step that proceeds between second portions 53d2 of the second resist pattern 53d of the metal plate 51 will be described. FIGS. 24 and 25 show the second surface etching step that proceeds on a cross-section along the XXIV-XXIV line on the metal plate 51 shown in FIG. 21.

As shown by the arrow in FIG. 24, etching of the metal plate 51 on the second surface 51b proceeds isotropically in various directions also between second portions 53d2 of the second resist pattern 53d. When etching proceeds in the planar direction of the metal plate 51 and thus two adjacent second recesses 35 are connected to each other, at least a portion of the second wall surface 36 of the second recess 35 is separated from the second portion 53d2 of the second resist pattern 53d. For example, a portion of the second wall surface 36 located between the center parts 32bc of the two first recesses 30 that are adjacent to each other in plan view is separated from the first portion 53d1. As a result, a gap is formed between the second portion 53d2 and the metal plate 51.

The second width W2 of the second portion 53d2 is smaller than the first width W1 of the first portion 53d1. Thus, two second recesses 35 that are adjacent to each other across the second portion 53d2 in plan view are connected at an earlier stage than two second recesses 35 that are adjacent to each other across the first portion 53d1 in plan view. Therefore, a gap between the second portion 53d2 and the metal plate 51 is formed earlier than a gap between the first portion 53d1 and the metal plate 51. The earlier the gap is formed, the greater the height of the wall surface of the opening 25 when the gap is formed. Accordingly, the height H2 of the second wall surface section 31b at a stage when a gap is formed between the second portion 53d2 and the metal plate 51 is greater than the height H1 of the first wall surface section 31a at a stage when a gap is formed between the first portion 53d1 and the metal plate 51. In addition, after the flow along the planar direction of the second surface 51b is generated in the second etching solution, the height of the first wall surface 31 of the first recess 30 is unlikely to decrease. Therefore, after the second surface etching step is completed, the height H2 of the second wall surface section 31b becomes greater than the height H1 of the first wall surface section 31a. Accordingly, a deposition mask 20 that is configured such that the first wall surface 31 of the first recess 30 of the opening 25 has a different height depending on the position can be obtained. The difference between the height H1 and the height H2 can be adjusted as appropriate based on the difference between the first width W1 of the first portion 53d1 and the second width W2 of the second portion 53d2 for the second resist pattern 53d or the like.

The production method of the deposition mask may further include an examination step of examining the deposition mask 20. The examination step includes at least one of a step of examining the position of a component of the deposition mask 20, a step of examining the dimension of a component of the deposition mask 20, or a step of examining the distance between two components of the deposition mask 20. A component to be examined is, for example, an opening 25.

The examination step may include a step of measuring the above-described heights H1 and H2 of the first wall surface 31 of the first recess 30 of the opening 25. The heights H1 and H2 may be the average value of heights measured for a plurality of samples.

Figure 26:
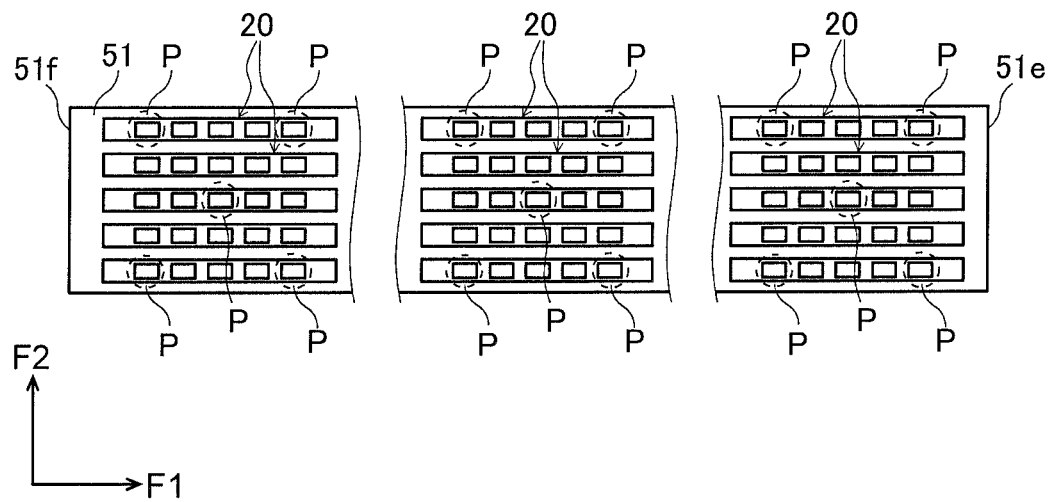
FIG. 26 is a plan view explaining another example of a method for measuring the height of a first wall surface of an opening of a deposition mask.

The plurality of samples may be extracted at a plurality of examination points P of the single deposition mask 20 as described above. Alternatively, the plurality of samples may be extracted at examination points P of a plurality of deposition masks 20. For example, as shown in FIG. 26, the plurality of samples may be extracted at a plurality of examination points P of a plurality of deposition masks 20 arranged in the width direction F2 of the metal plate 51 near the front end 51e in the length direction FI of the metal plate 51. The plurality of samples may be extracted at a plurality of examination points P of a plurality of deposition masks 20 arranged in the width direction F2 of the metal plate 51 near the rear end 51f in the length direction F1 of the metal plate 51. In addition, the plurality of samples may be extracted at a plurality of examination points P of a plurality of deposition masks 20 arranged in the width direction F2 of the metal plate 51 at an intermediate part between the front end 51e and the rear end 51f of the metal plate 51. The average value of heights measured at the thus extracted plurality of samples can be used as the above-described heights H1 and H2 of the first wall surface 31 of the first recess 30 of the opening 25.

The examination step may include a judgment step of judging the accept/reject status of the deposition mask 20 based on the difference between the above-described heights H1 and H2 of the first wall surface 31 of the first recess 30 of the opening 25. In the judgment step, for example, a deposition mask 20 having the height H1 which is lower than the height H2 is judged to be acceptable. In the judgment step, for example, the deposition mask 20 having the height H1 which is 1 µm lower than the height H2 may be judged to be acceptable.

Next, a welding step of welding the deposition mask 20 in a state in which a tension is applied to the deposition mask 20 obtained as above to a flame 15 is performed. The tension is adjusted such that a plurality of openings 25 of the deposition mask 20 are aligned with each other. Accordingly, the deposition mask apparatus 10 including the deposition mask 20 and the flame 15 can be obtained.

Next, a production method of the organic EL display device 100 using the deposition mask 20 of this embodiment will be described. The production method of the organic EL display device 100 comprises a deposition step of allowing the deposition material 98 to be deposited on the substrate such as the organic EL substrate 92 using the deposition mask 20. In the deposition step, first, the deposition mask apparatus 10 is disposed such that the deposition mask 20 faces the organic EL substrate 92. In addition, the deposition mask 20 is brought into close contact with the organic EL substrate 92 using the magnet 93. Further, a vacuum atmosphere is created inside of the deposition apparatus 90. In such a state, the deposition material 98 is evaporated so as to fly to the organic EL substrate 92 via the deposition mask 20. Thus, it is possible for the deposition material 98 to adhere to the organic EL substrate 92 in a pattern corresponding to the openings 25 of the deposition mask 20.

In addition, in this embodiment, the first end 32 on the first surface 20a of an opening 25 of the deposition mask 20 includes a pair of first portions 32a that extend in the first direction D1 direction and a pair of second portions 32b that extend in the second direction D2 intersecting the first direction D1 and have a dimension shorter than that of the first portions 32a. The height H1 of the first wall surface section 31a including the first portion 32a is lower than the height H2 of the second wall surface section 31b including the second portion 32b. For this reason, it is possible to suppress the occurrence of shadow during the deposition step in the first wall surface section 31a having a dimension larger than that of the second wall surface section 31b. Accordingly, it is possible to increase the effective area of the deposition layer 99 formed on the organic EL substrate 92 while suppressing a decrease in the strength of the deposition mask 20.

The production method of the organic EL display device 100 may comprise various steps, in addition to the deposition step of allowing the deposition material 98 to be deposited on the substrate such as the organic EL substrate 92 using the deposition mask 20. For example, the production method of the organic EL display device 100 may comprise a step of forming a first electrode on the substrate. the deposition layer is formed on the first electrode. In addition, the production method of the organic EL display device 100 may comprise a step of forming a second electrode on the deposition layer. The production method of the organic EL display device 100 may also include a sealing step of sealing the first electrode, the deposition layer, and the second electrode provided on the organic EL substrate 92.

Further, the deposition layer that is formed on the substrate such as the organic EL substrate 92 using the deposition mask 20 may include other layers which are not limited to the above-described luminescent layer. For example, the deposition layer may include a hole injection layer, a hole transport layer, a luminescent layer, an electron transport layer, an electron injection layer, and the like in that order from the first electrode side. In this case, a deposition step may be performed using a deposition mask 20 corresponding to each layer.

The aforementioned embodiment can be variously modified. Hereinafter, modification examples are described with reference to the drawings according to need. In the below description and the drawings used in the below description, a part that can be similarly constituted to the above embodiment has the same reference sign as that of corresponding part the above embodiment, and overlapped description is omitted. In addition, when the effect obtained by the aforementioned embodiment is apparently obtained in the modification examples, description thereof is possibly omitted.

(First Modified Example of Organic EL Display Device)

Figure 27:
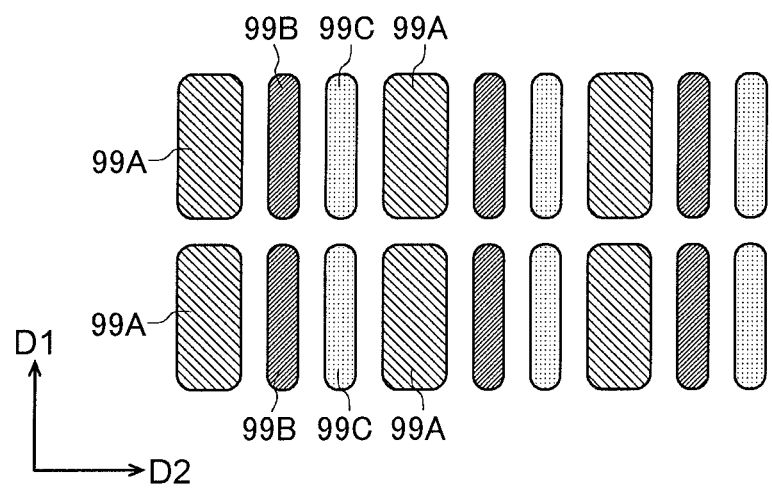
FIG. 27 is a plan view illustrating a first modified example of an organic EL display device.

FIG. 13 illustrates an example in which the second deposition layer 99B and the third deposition layer 99C are arranged along a direction in which the long side of the first deposition layer 99A extends according to the above-described embodiment. However, the example is not limited, and as illustrated in FIG. 27, second deposition layer 99B and third deposition layer 99C may be arranged in a direction orthogonal to the direction in which the long side of the first deposition layer 99A extends. In this case, as illustrated in FIG. 27, the second deposition layer 99B and the third deposition layer 99C may also have a pair of long sides and a pair of short sides as with the first deposition layer 99A. Such second deposition layer 99B and third deposition layer 99C may be formed using a deposition mask 20 that is configured to have the first end 32 including the first portion 32a and the second portion 32b having different lengths as in the case of the first deposition layer 99A.

(Second Modified Example of Organic EL Display Device)

Figure 28A:
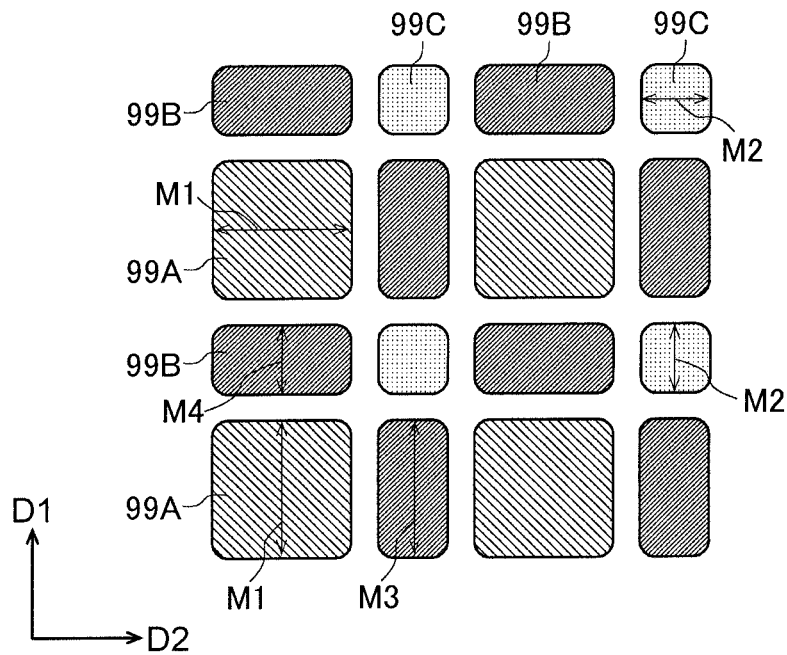
FIG. 28A is a plan view illustrating a second modified example of an organic EL display device.

FIG. 13 illustrates an example in which by increasing the length of a pair of sides of the first deposition layer 99A compared to the length of the other pair of sides, the area of the first deposition layer 99A is expanded compared to the areas of other deposition layers 99B and 99C according to the above-described embodiment. However, a specific method for increasing the area of a first deposition layer 99A compared to the areas of other deposition layers 99B and 99C is not particularly limited. For example, as illustrated in FIG. 28A, the first deposition layer 99A may include four sides having a dimension M1 and the third deposition layer 99C may include four sides having a dimension M2 smaller than the dimension M1. The second deposition layer 99B may include a pair of sides having a dimension M3 and a pair of sides having a dimension M4 smaller than the dimension M3. The sides having a dimension M3 of the second deposition layer 99B may face the sides of the first deposition layer 99A in the first direction D1 or second direction D2. The sides having a dimension M4 of the second deposition layer 99B may face the sides of the third deposition layer 99C in the first direction D1 or second direction D2. The dimension M3 may be the same as the dimension M1. The dimension M4 may be the same as the dimension M2. The second deposition layer 99B may be formed using the deposition mask 20 that is configured to have the first end 32 including the first portion 32a and the second portion 32b having different lengths as illustrated in FIG. 29.

The first direction D1 may coincide with the length direction or the width direction of the deposition mask 20. The first direction D1 may be inclined with respect to the length direction or the width direction of the deposition mask 20. For example, the first direction D1 may be inclined with an angle of 45 degrees with respect to the length direction of the deposition mask 20. The first deposition layer 99A, the second deposition layer 99B, and the third deposition layer 99C may emit blue light, green light, and red light, respectively.

Figure 29:
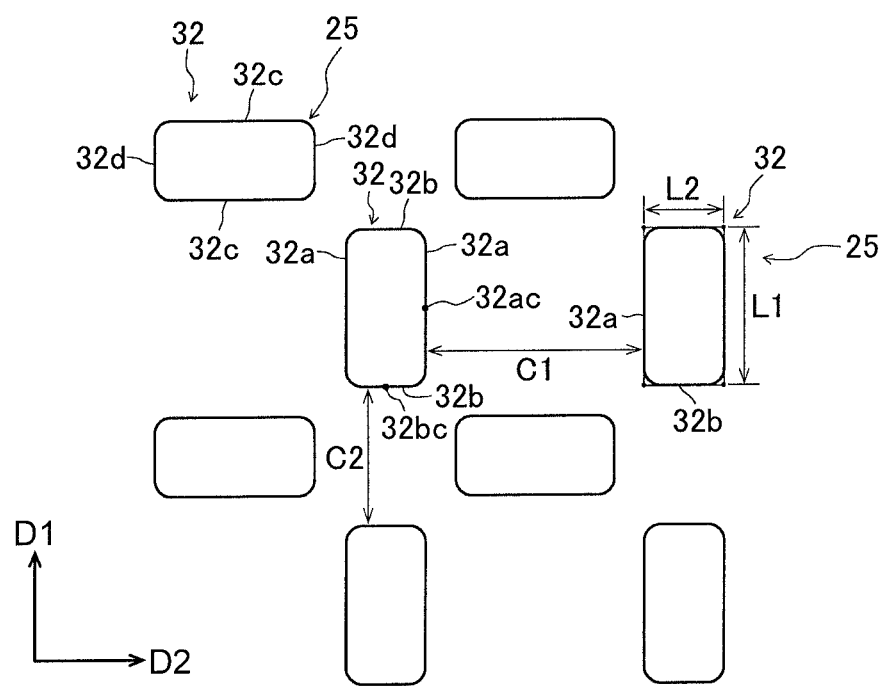
FIG. 29 is a plan view showing a first end of an opening of a deposition mask used for forming the second deposition layer of the organic EL display device of FIG. 28A at an increased magnification.

As illustrated in FIG. 29, the deposition mask 20 may further has an opening 25 having a first end 32 including a third portion 32c and a fourth portion 32d having different lengths, in addition to an opening 25 having a first end 32 including a first portion 32a and a second portion 32b having different lengths. The opening 25 having the first end 32 including the third portion 32c and the fourth portion 32d corresponds to an opening which is obtained by rotating the opening 25 having the first end 32 including the first portion 32a and the second portion 32b 90 degrees in plan view.

Figure 28B:
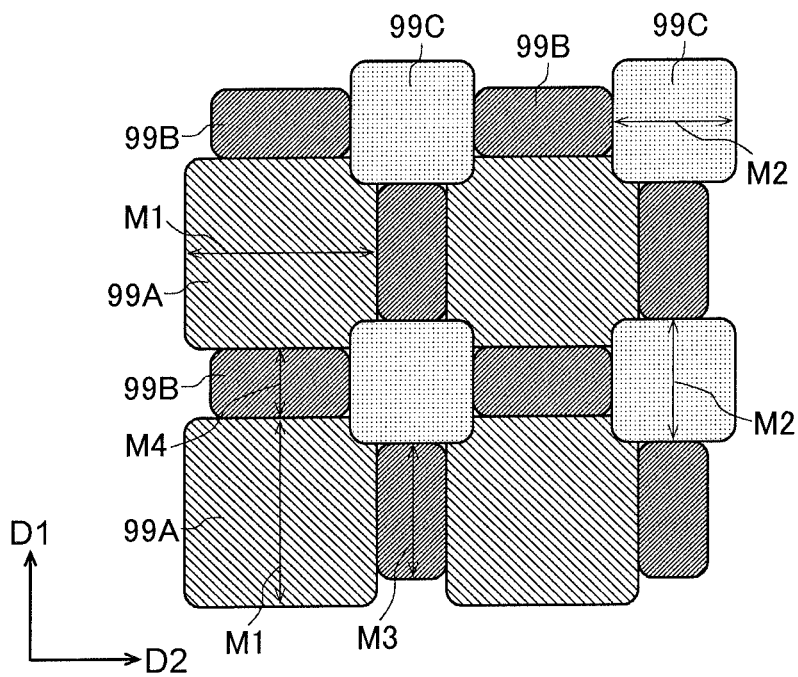
FIG. 28B is a plan view illustrating another example of a second modified example of an organic EL display device.

FIGS. 13, 27, and 28A above show examples in which there is a gap between deposition layers in plan view, which however are not restrictive. As shown in FIG. 28B, for example, the first deposition layer 99A and the third deposition layer 99C may be in contact with each other in plan view. The second deposition layer 99B may also be in contact with the first deposition layer 99A in plan view or in contact with the third deposition layer 99C in plan view. Two adjacent deposition layers described later in examples also may be in contact with each other. The second deposition layer 99B in FIG. 28B can be formed using a deposition mask 20 shown in FIG. 29 as in the second deposition layer 99B in FIG. 28A.

As shown in FIG. 28B, the dimension M3 of a side of the second deposition layer 99B may be smaller than the dimension M1 of a side of the first deposition layer 99A. The dimension M4 of a side of the second deposition layer 99B may be smaller than the dimension M2 of a side of the third deposition layer 99C (Third Modified Example of Organic EL Display Device)

Figure 30:
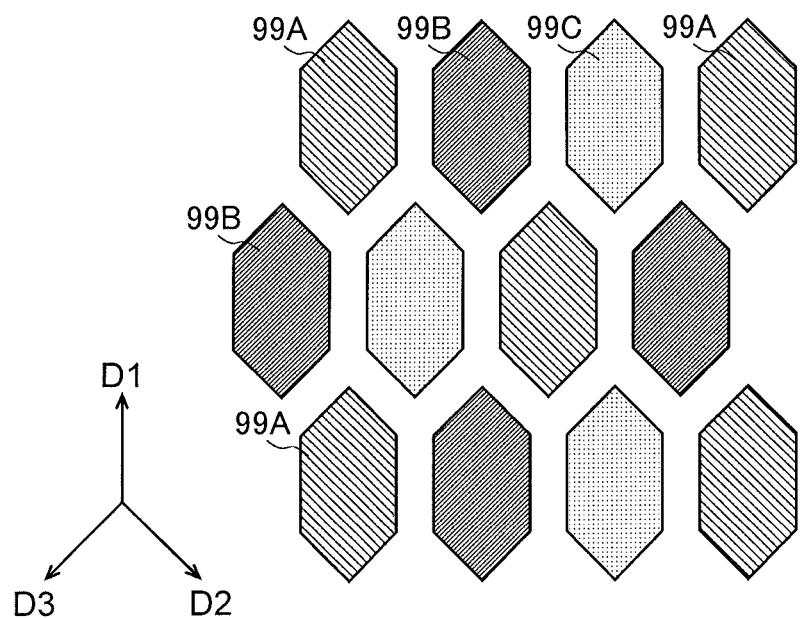
FIG. 30 is a plan view illustrating a third modified example of an organic EL display device.

In the above-described embodiment and modified example, an example in which the shape of the outline of the deposition layer 99 and the shape of the first end 32 of the opening 25 of the deposition mask 20 are rectangular is presented. However, as long as an opening 25 has the first end 32 including the first portion 32a and the second portion 32b having different lengths, the outline of the deposition layer 99 and the shape or pattern of the opening 25 are not particularly limited. For example, as shown in FIG. 30, deposition layers 99A, 99B, 99C may have a hexagonal outline.

Figure 31:
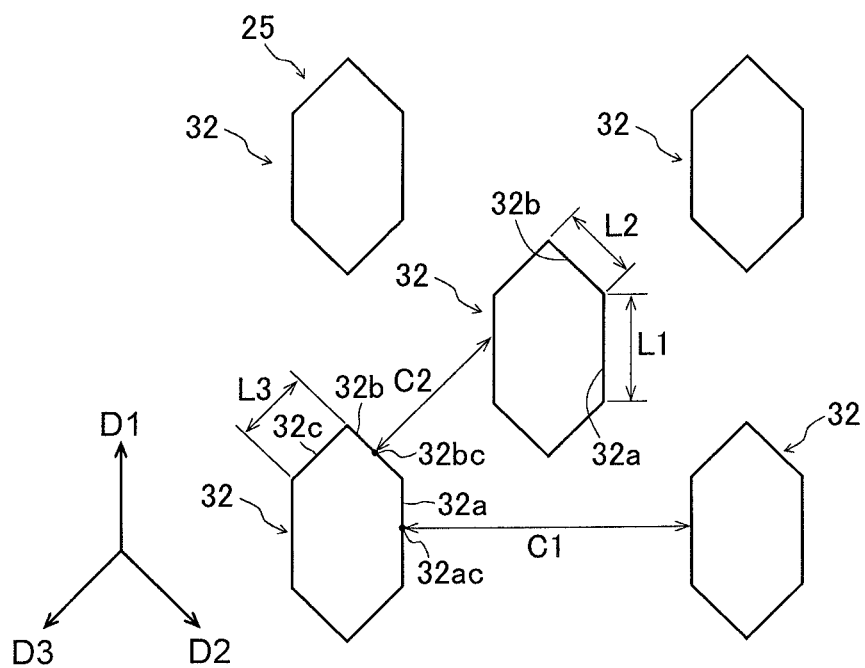
FIG. 31 is a plan view showing a first end of an opening of a deposition mask used for forming the first deposition layer of the organic EL display device of FIG. 30 at an increased magnification.

FIG. 31 is a plan view showing a deposition mask 20 used for forming the first deposition layer 99A. A first end 32 of an opening 25 of the deposition mask 20 includes a pair of first portions 32a that extend in the first direction D1 direction, a pair of second portions 32b that extend in the second direction D2 intersecting the first direction D1, and a pair of third portions 32c that extend in the third direction D3 intersecting the first direction D1 and the second direction D2. Each of the second direction D2 and the third direction D3 intersects the first direction D1 with an angle of more than 90 degrees and less than 180 degrees. Each first portion 32a has a first dimension L1 in the first direction D1, each second portion 32b has a second dimension L2 smaller than the first dimension L1 in the second direction D2, and each third portion 32c has a third dimension L3 smaller than the first dimension L1 in the third direction D3.

As shown in FIG. 31, the first portions 32a of two adjacent openings 25 in a direction orthogonal to the first direction D1 face each other across a first interval C1. The second portions 32b of two adjacent openings 25 in a direction orthogonal to the second direction D2 face each other across a second interval C2. The first interval C1 is greater than the second interval C2. Thus, as in the case of the above-described embodiment, the first width W1 of the first portion 53d1 of the second resist pattern 53d that is provided to the second surface 51b of the metal plate 51 at a portion corresponding to the first interval C1 is greater than the second width W2 of the second portion 53d2 of the second resist pattern 53d that provided to the second surface 51b of the metal plate 51 at a portion corresponding to the second interval C2. Therefore, as in the case of the above-described embodiment, also in this modified example, by performing the second surface etching step, it is possible to reduce the height H1 of a portion that is connected to the first portion 32a of first end 32 of the first wall surface 31 compared to the height H2 of a portion that is connected to the second portion 32b of the first end 32 of a first wall surface 31. For this reason, it is possible to suppress the occurrence of shadow during the deposition step in the first wall surface 31 which is connected to the first portion 32a having a larger dimension. Accordingly, it is possible to increase the effective area of the deposition layer 99 formed on the organic EL substrate 92 while suppressing a decrease in the strength of the deposition mask 20.

The height H1 which is lower than the height H2 also can be described as below based on the second interval C2 which is smaller than the first interval C1. It is assumed herein that the top portion 43 exist at least partially between two adjacent openings 25. In this case, since the second interval C2 is smaller than the first interval C1, the distance between the second portion 32b and the top portion 43 of the opening 25 is shorter than the distance between the first portion 32a and the top portion 43 of the opening 25. As a result, at a portion corresponding to the second portion 32b of an opening 25, the position of a connection 41 is closer to the second surface 51b, compared to a portion corresponding to the first portion 32a. In other words, the height H1 is lower than the height H2.

Figure 32:
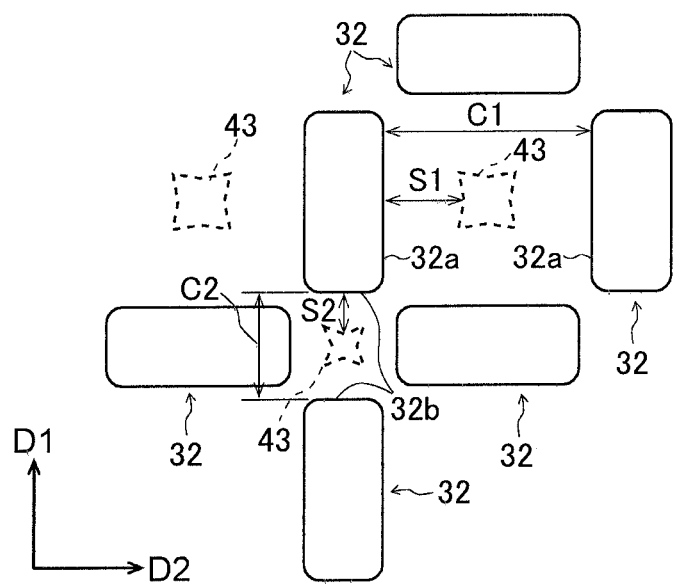
FIG. 32 is a plan view showing a first end of an opening of the deposition mask.

The height H1 which is lower than the height H2 in a case in which the second interval C2 is smaller than the first interval C1 will be described with reference to FIGS. 32 to 34. FIG. 32 is a plan view showing the first end 32 of the opening 25 of the deposition mask 20. In the example shown in FIG. 32, the first ends 32 of the openings 25 include the first portions 32a that face across the first interval C1 in the second direction D2 orthogonal to the first direction D1 and the second portions 32b that face across the second interval C2 in the first direction D1. The first interval C1 is greater than the second interval C2. There is the top portion 43 on the second surface 51b of the metal plate 51 between the first portions 32a facing each other across the first interval C1 in the second direction D2. There is also a top portion 43 on the second surface 51b of the metal plate 51 between the second portions 32b facing each other across the second interval C2 in the first direction D1.

Figure 33:
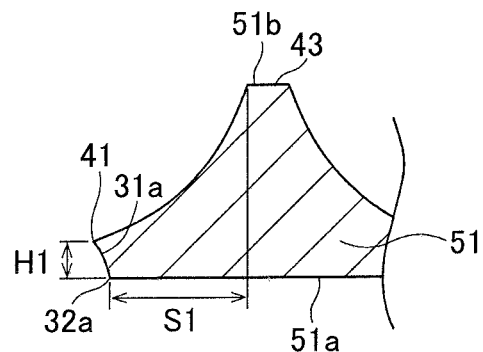
FIG. 33 is a cross-sectional view illustrating a first portion of the first end of the opening of FIG. 32.

FIG. 33 is a cross-sectional view illustrating the first portion 32a of the first end 32 of the opening 25 in FIG. 32. In FIGS. 32 and 33, a reference sign S1 represents the distance between the top portion 43 and the first portion 32a of the first end 32 in the direction in which the first portion 32a faces.

Figure 34:
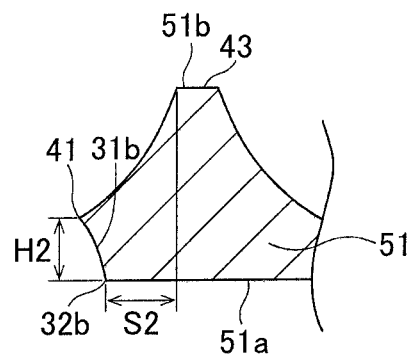
FIG. 34 is a cross-sectional view illustrating a second portion of the first end of the opening of FIG. 32.

FIG. 34 is a cross-sectional view illustrating the second portion 32b of the first end 32 of the opening 25 in FIG. 32. In FIGS. 32 and 34, a reference sign S2 represents the distance between the top portion 43 and the second portion 32b of the first end 32 in the direction in which the second portion 32b faces.

In the examples shown in FIGS. 32 to 34, the second interval C2 is smaller than the first interval C1. Therefore, a distance S2 between the top portion 43 and the second portion 32b of the first end 32 also become smaller than a distance S1 between the top portion 43 and the first portion 32a of the first end 32. As shown in FIGS. 33 and 34, as the distance between the top portion 43 and the first end 32 decreases, a connection 41 is located closer to the second surface 51b. Therefore, in a case in which the second interval C2 is smaller than the first interval C1, the height H2 is higher than the height H1. In other words, in a case in which the second interval C2 is smaller than the first interval C1, the height H1 becomes lower than the height H2.

(Modified Example of First End of Opening of Deposition Mask)

Figures 35, 36:
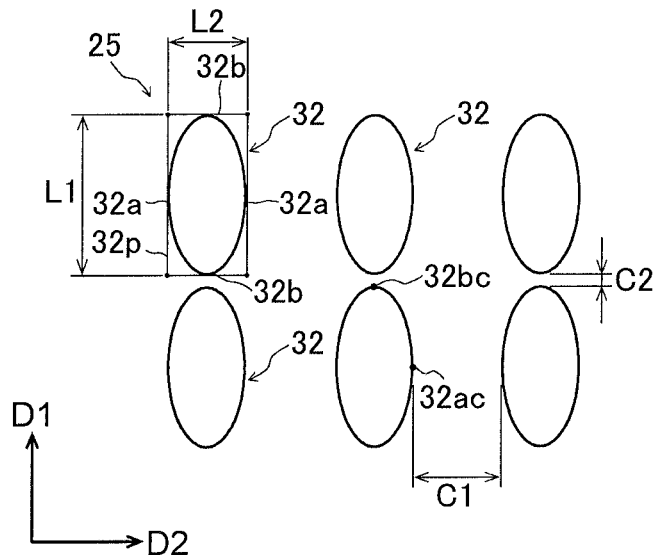
FIG. 35 is a plan view showing a first end of an opening of a deposition mask in one modified example at an increased magnification.
FIG. 36 is a view depicting the results of Examples 1 to 3 and Comparative Examples 1 and 2.

In the above-described embodiment and the modified example, an example in which the first portion 32a and the second portion 32b of the first end 32 of the opening 25 of the deposition mask 20 extend in the first direction D1 and the second direction D2, respectively, is shown. However, as long as a first dimension L1 of a first portion 32a in the first direction D1 is larger than a second dimension L2 of the second portion 32b in the second direction D2, specific shapes of the first portion 32a and the second portion 32b are not particularly limited. For example, as shown in FIG. 35, the first end 32 may have an oval shape in plan view. In this case, the first dimension L1 of the first portion 32a includes a pair of sides that extend in the first direction D1 and a pair of sides that extend in the second direction D2, and corresponds to the length of a side of a rectangle 32p circumscribing the first end 32 which extends in the first direction D1. In addition, the second dimension L2 of the second portion 32b corresponds to the length of a side of the above-described quadrangle 32p circumscribing the first end 32 which extends in the second direction D2.

Also in this modified example, the height H1 of a portion that is connected to the first portion 32a of the first end 32 of the first wall surface 31 is lower than the height H2 of a portion that is connected to the second portion 32b of the first end 32 of the first wall surface 31. For this reason, it is possible to suppress the occurrence of shadow during the deposition step in the first wall surface 31 which is connected to the first portion 32a having a larger dimension. Accordingly, it is possible to increase the effective area of the deposition layer 99 formed on the organic EL substrate 92 while suppressing a decrease in the strength of the deposition mask 20.

(Modified Example of Wall Height of Opening of Deposition Mask)

In the above-described embodiment and the modified example, an example in which the height H1 of the first wall surface section 31a of the first wall surface 31 of the opening 25 is lower than the height H2 of the second wall surface section 31b of the first wall surface 31 of the opening 25 is shown. In addition, an example in which two second recesses 35 that are adjacent to each other across the second portion 53d2 in plan view are connected at an earlier stage than two second recesses 35 that are adjacent to each other across the first portion 53d1 in plan view. Therefore, an example in which a gap between the second portion 53d2 and the metal plate 51 is formed earlier than a gap between the first portion 53d1 and the metal plate 51 is shown. In this case, the first height H11 shown in FIG. 9 may be higher than the second height H12 shown in FIG. 10. This is because the later a gap is formed between the second resist pattern 53d and the metal plate 51, the larger the height of the entire wall surface is maintained. The difference between the height H11 and the height H12 is, for example, 0 µm, and it may be 0.1×T or more, 0.2×T or more, or 0.3×T or more. T represents the thickness of the deposition mask 20. In addition, the difference between the first height H11 and the second height H12 is, for example, 0.7×T or less, and it may be 0.5×T or less or 0.4×T or less. Accordingly, it is possible to increase the effective area of the deposition layer 99 formed on the organic EL substrate 92 while suppressing a decrease in the strength of the deposition mask 20.

The range of the difference between the first height H11 and the second height H12 may be determined based on a combination of any of the plurality of lower limit candidate values described above and any of the plurality of upper limit candidate values described above. For example, it may be 0 µm or more and 0.7×T or less, 0.1×T or more and 0.7×T or less, 0.2×T or more and 0.5×T or less, or 0.3×T or more and 0.4×T or less. In addition, the range of the difference between the first height H11 and the second height H12 may be determined based on a combination of any two of the plurality of lower limit candidate values described above. For example, it may be 0 µm or more and 0.3×T or less, 0.1×T or more and 0.3×T or less, 0.1×T or more and 0.2×T or less, or 0.2×T or more and 0.3×T or less. Further, the range of the difference between the first height H11 and the second height H12 may be determined based on a combination of any two of the plurality of upper limit candidate values described above. For example, it may be 0.4×T or more and 0.7×T or less, 0.4×T or more and 0.5×T or less, or 0.5×T or more and 0.7×T or less.

EXAMPLES

Next, the embodiment of the disclosure is described in more detail based on examples, and the embodiment of the disclosure is not limited to the below description of the examples unless the embodiment departs from its spirit.

Example 1

Deposition masks 20 having structures illustrated in FIGS. 8 to 10 were prepared. The dimensions of respective portions of a deposition mask 20 are as follows.
Height H1 of first wall surface section 31a: 3 μm
Height H2 of second wall surface section 31b: 4 μm
First dimension L1 of first portion 32a: 48 μm
Second dimension L2 of second portion 32b: 46 μm Next, the strength of each deposition mask 20 was evaluated. Specifically, it was confirmed whether or not a wavy shape appeared on a deposition mask 20 when a tension of 1 kgf was applied to the deposition mask 20 along the length direction of the deposition mask 20 while holding a pair of end parts 17a, 17b of the deposition mask 20. A wavy shape is more likely to appear as the strength of a deposition mask 20 decreases. Such a wavy shape may include a plurality of peak portions that are arranged along the width direction of the deposition mask 20 intersecting the length direction of the same. In the description below, the average value of intervals between the plurality of peak portions arranged in the width direction of the deposition mask 20 is also referred to as a "wavy shape cycle".

When a tension of 1 kgf was applied to each deposition mask 20, no visually observable wavy shape appeared on the deposition mask 20.

Next, each deposition mask 20 was used for carrying out a deposition step of allowing a deposition material 98 to adhere to a substrate 92, thereby forming a deposition layer 99. Then, among the dimensions of the deposition layer 99, thickness E1 shown in FIGS. 9 and 10 was measured. In addition, thickness E2 was set to 95% of thickness E1, and the dimension L4 shown in FIG. 9 and the dimension L3 shown in FIG. 10 were calculated. As a result, the dimension L4 was 40 μm, and the dimension L3 was 40 μm. In addition, distance K1 shown in FIG. 9 was calculated based on the dimensions L2, L4, and distance K2 in FIG. 10 was calculated based on the dimensions L1, L3. As a result, the distance K1 was 3 μm, and the distance K2 was 4 μm. Here, K1=(L2−L4)/2 and K2=(L1−L3)/2 are established.

Example 2

Deposition masks 20 having structures illustrated in FIGS. 8 to 10 were prepared. The dimensions of respective portions of a deposition mask 20 are as follows.
Height H1 of first wall surface section 31a: 2 μm
Height H2 of second wall surface section 31b: 4 μm
First dimension L1 of first portion 32a: 48 μm
Second dimension L2 of second portion 32b: 46 μm Next, the strength of each deposition mask 20 was evaluated as in the case of Example 1. When a tension of 1 kgf was applied to each deposition mask 20, no visually observable wavy shape appeared on the deposition mask 20.

Then, the deposition step using a deposition mask 20 was carried out as in the case of Example 1. In addition, dimension L4 and dimension L3 were calculated as in the case of Example 1. As a result, the dimension L4 was 42 μm, and the dimension L3 was 40 μm. In addition, distance K1 was calculated based on the dimensions L2, L4, and distance K2 was calculated based on the dimensions L1, L3. As a result, the distance K1 was 2 μm, and the distance K2 was 4 μm.

Example 3

Deposition masks 20 having structures illustrated in FIGS. 8 to 10 were prepared. The dimensions of respective portions of a deposition mask 20 are as follows.
Height H1 of first wall surface section 31a: 2 μm
Height H2 of second wall surface section 31b: 3 μm
First dimension L1 of first portion 32a: 48 μm
Second dimension L2 of second portion 32b: 46 μm Next, the strength of each deposition mask 20 was evaluated as in the case of Example 1. When a tension of 1 kgf was applied to each deposition mask 20, no visually observable wavy shape appeared on the deposition mask 20. The wavy shape cycle was large, which was specifically 30 mm or more. In addition, two peak portions that were arranged along the width direction of the deposition mask 20 were confirmed.

Then, the deposition step using a deposition mask 20 was carried out as in the case of Example 1. In addition, dimension L4 and dimension L3 were calculated as in the case of Example 1. As a result, the dimension L4 was 42 μm, and the dimension L3 was 42 μm. In addition, distance K1 was calculated based on the dimensions L2, L4, and distance K2 was calculated based on the dimensions L1, L3. As a result, the distance K1 was 2 μm, and the distance K2 was 3 μm.

Comparative Example 1

Deposition masks 20 having structures illustrated in FIGS. 8 to 10 were prepared. The dimensions of respective portions of a deposition mask 20 are as follows.
Height H1 of first wall surface section 31a: 4 μm
Height H2 of second wall surface section 31b: 4 μm
First dimension L1 of first portion 32a: 48 μm
Second dimension L2 of second portion 32b: 46 μm Next, the strength of each deposition mask 20 was evaluated as in the case of Example 1. When a tension of 1 kgf was applied to each deposition mask 20, no visually observable wavy shape appeared on the deposition mask 20.

Then, the deposition step using a deposition mask 20 was carried out as in the case of Example 1. In addition, dimension L4 and dimension L3 were calculated as in the case of Example 1. As a result, the dimension L4 was 38 μm, and the dimension L3 was 40 μm. In addition, distance K1 was calculated based on the dimensions L2, L4, and distance K2 was calculated based on the dimensions L1, L3. As a result, the distance K1 was 4 μm, and the distance K2 was 4 μm.

Comparative Example 2

Deposition masks 20 having structures illustrated in FIGS. 8 to 10 were prepared. The dimensions of respective portions of a deposition mask 20 are as follows.
Height H1 of first wall surface section 31a: 2 μm
Height H2 of second wall surface section 31b: 2 μm First dimension L1 of first portion 32a: 48 μm Second dimension L2 of second portion 32b: 46 μm Next, the strength of each deposition mask 20 was evaluated as in the case of Example 1. When a tension of 1 kgf was applied to each deposition mask 20, a visually observable wavy shape appeared on the deposition mask 20. In addition, the wavy shape cycle was small, which was specifically less than 20 mm. In addition, three peak portions that were arranged along the width direction of the deposition mask 20 were confirmed.

Then, the deposition step using a deposition mask 20 was carried out as in the case of Example 1. In addition, dimension L4 and dimension L3 were calculated as in the case of Example 1. As a result, the dimension L4 was 42 μm, and the dimension L3 was 44 μm. In addition, distance K1 was calculated based on the dimensions L2, L4, and distance K2 was calculated based on the dimensions L1, L3. As a result, the distance K1 was 2 μm, and the distance K2 was 2 μm.

The results of Examples 1 to 3 and Comparative Examples 1 and 2 are summarized in FIG. 36. In the column of effective area in FIG. 36, "great" means that the distance K1 from the first portion 32a of the first end 32 to the effective edge 99e of the deposition layer 99 was 2 μm or less. In addition, "good" means that the distance K1 was more than 2 μm and 3 μm or less. "Bad" means that the distance K1 was 4 μm or more. In the column of strength in FIG. 36, "great" means that no visually observable wavy shape appeared on the deposition mask. "Good" means that a visually observable wavy shape appeared in the width direction of the deposition mask, but the number of wavy shape peak portions arranged in the width direction of the deposition mask was 2 or less. In addition, "bad" means that a visually observable wavy shape appeared on the deposition mask, and the number of wavy shape peak portions arranged in the width direction of the deposition mask was 3 or more. According to Examples 1 to 3, by making the height M1 smaller than the height H2, it was possible to suppress the deformation of the deposition mask 20 while increasing the effective area of the deposition layer 99.

The invention claimed is:

1. A deposition mask, comprising:
a metal plate including a planar first surface and a planar second surface that is located opposite to the planar first surface; and
openings passing through the metal plate from the planar first surface to the planar second surface,
wherein some of the openings includes a first recess, which is recessed from the planar first surface toward the planar second surface, and a second recess, which is recessed from the planar second surface toward the planar first surface and connected to the first recess by a circumferential connection line,
wherein the first recess includes a first end located on the planar first surface and a first wall surface extending from the first end of the first wall surface to the circumferential connection line,
wherein the circumferential connection line is located closer to a center of each of the openings than the first end is,
wherein, when each of the openings is viewed from the first surface side along a normal direction of the planar first surface, a first end of each of the openings includes a pair of first portions located on the planar first surface that extend in a first direction and have a first dimension, and a pair of second portions located on the planar first surface that extend in a second direction intersecting the first direction and that have a second dimension, and wherein the second dimension is shorter than the first dimension,
wherein the first wall surface includes a pair of first wall surface sections that extend from the first portions of the openings toward the circumferential connection line, and a pair of second wall surface sections that extend from the second portions of the openings toward the circumferential connection line, and
wherein heights of the pair of the first wall surface sections at center parts of the first portions in the first direction are lower than heights of the pair of the second wall surface sections at center parts of the second portions in the second direction.

2. The deposition mask according to claim 1, wherein the second dimension is 2 μm or more shorter than the first dimension, and
wherein the heights of the pair of the first wall surface sections at the center parts of the first portions in the first direction are 1 μm or more lower than the heights of the pair of the second wall surface sections at the center parts of the second portions in the second direction.

3. The deposition mask according to claim 1, wherein the first direction and the second direction are orthogonal to each other,
wherein when the openings are viewed from the first surface side along the normal direction of the planar first surface, a first interval is greater than a second interval,
wherein the first interval is an interval between the center parts of the first portions of two of the openings which are adjacent to each other in the second direction, and
wherein the second interval is an interval between the center parts of the second portions of two of the openings which are adjacent to each other in the first direction.

4. The deposition mask according to claim 3, wherein a difference between the first interval and the second interval is 2 μm or more.

5. The deposition mask according to claim 3, wherein a difference between the first interval and the second interval is 5 μm or more.

6. The deposition mask according to claim 3, wherein a difference between the first interval and the second interval is 100 μm or less.

7. The deposition mask according to claim 1, wherein a first height and a second height are smaller than a thickness of the deposition mask,
wherein the first height is the height of the wall surface on a cross-section orthogonal to the first direction including a center part of the first portion, and
wherein the second height is the height of the wall surface on a cross-section orthogonal to the second direction including a center part of the second portion.

8. The deposition mask according to claim 7, wherein a difference between the first height and the second height is 0.3 times or more the thickness of the deposition mask.

9. The deposition mask according to claim 7, wherein a difference between the first height and the second height is 0.7 times or less the thickness of the deposition mask.

10. The deposition mask according to claim 1, wherein the heights of the pair of the first wall surface sections at the center parts of the first portions in the first direction and the height of the pair of the second wall surface sections at the center parts of the second portions in the second direction are 5 μm or less.

11. The deposition mask according to claim 1, wherein the thickness of the deposition mask is 30 µm or less.

12. The deposition mask according to claim 1, wherein the planar second surface includes top portions, and wherein some of the top portions are located between two adjacent ones of the openings.

13. A production method of a deposition mask, comprising:
- a step of preparing a metal plate including a planar first surface and a planar second surface that is located opposite to the planar first surface; and
- an etching step of etching the metal plate, thereby forming openings in the metal plate,
- wherein some of the openings includes a first recess formed by a first etching step of etching the planar first surface using an etching solution, and a second recess formed by a second etching step of etching the planar first surface using an etching solution, the second recess being connected to the first recess by a circumferential connection line,
- wherein the first recess includes a first end located on the planar first surface and a first wall surface extending from the first end of the wall surface to the circumferential connection line,
- wherein the circumferential connection line is located closer to a center of each of the openings than the first end is,
- wherein the etching step includes a first surface etching step of etching the planar first surface using an etching solution, thereby forming the first wall surface, and a planar second surface etching step of etching the planar second surface using an etching solution, thereby forming the second wall surface,
- wherein, when the each of the openings is viewed from the first surface side along a normal direction of the planar first surface, a first end of the openings includes a pair of first portions extending in a first direction and having a first dimension, and a pair of second portions extending in a second direction, intersecting the first direction, and having a second dimension that is shorter than the first dimension,
- wherein the first wall surface includes a pair of first wall surface sections that extend from the first portions toward the circumferential connection line, and a pair of second wall surface sections that extend from the second portions toward the circumferential connection line, and
- wherein heights of the pair of the first wall surface sections at center parts of the first portions in the first direction are lower than heights of the second wall surface sections at center parts of the second portions in the second direction.

14. The production method of a deposition mask according to claim 13, wherein the second dimension is 2 µm or more shorter than the first dimension, and
- wherein the heights of the pair of the first wall surface sections at the center parts of the first portions in the first direction are 1 µm or more lower than the heights of the pair of the second wall surface sections at the center parts of the second portions in the second direction.

15. The production method of a deposition mask according to claim 13, wherein the planar second surface etching step includes a step of etching an area of the planar second surface which is not covered with a second resist pattern using an etching solution,
- wherein the second resist pattern includes a first resist portion that extends along the first portion of the first end and has a first width and a second resist portion that extends along the second portion of the first end and has a second width, and
- wherein the first width is greater than the second width.

16. The production method of a deposition mask according to claim 15, wherein a difference between the first width and the second width is 2 µm or more.

17. The production method of a deposition mask according to claim 15, wherein a difference between the first width and the second width is 5 µm or more.

18. The production method of a deposition mask according to claim 15, wherein a difference between the first width and the second width is 100 µm or less.

19. The production method of a deposition mask according to claim 15, wherein the second surface etching step is carried out until a gap is formed between the metal plate and the first resist portion and between the metal plate and the second resist portion.

20. The production method of a deposition mask according to claim 13, wherein the thickness of the metal plate is 50 µm or less.

21. The production method of a deposition mask according to claim 13, wherein portions of the planar second surface that have not been etched in the second etching step thus remain to constitute top portions, and wherein some of the top portions are located between two adjacent ones of the openings.

* * * * *